(12) United States Patent
Choi

(10) Patent No.: US 12,713,786 B2
(45) Date of Patent: Aug. 18, 2026

(54) LIGHT TRANSMISSION AREA AND DISPLAY DEVICE HAVING THE SAME

(71) Applicant: Samsung Display Co., Ltd., Yongin-si (KR)

(72) Inventor: Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 422 days.

(21) Appl. No.: 18/347,202

(22) Filed: Jul. 5, 2023

(65) Prior Publication Data

US 2024/0155884 A1 May 9, 2024

(30) Foreign Application Priority Data

Nov. 4, 2022 (KR) ........................ 10-2022-0145946

(51) Int. Cl.
*H10K 59/124* (2023.01)
*H10K 59/121* (2023.01)
*H10K 59/80* (2023.01)

(52) U.S. Cl.
CPC ....... *H10K 59/124* (2023.02); *H10K 59/1213* (2023.02); *H10K 59/879* (2023.02)

(58) Field of Classification Search
CPC .. H10D 30/6755; H10D 86/43; H10K 59/124; H10K 59/1213; H10K 59/879; H10K 50/858; H10K 50/81; H10K 50/82; H10K 59/00; H10K 59/122; H10K 59/123; H10K 59/88; H10K 77/10
See application file for complete search history.

(56) References Cited

U.S. PATENT DOCUMENTS

| | | | |
|---|---|---|---|
| 11,678,555 B2 | 6/2023 | Chung et al. | |
| 12,302,713 B2 | 5/2025 | Choi et al. | |
| 2018/0102382 A1* | 4/2018 | Peng | G02F 1/1368 |
| 2019/0278145 A1 | 9/2019 | Tanaka et al. | |
| 2021/0335920 A1 | 10/2021 | Hong et al. | |
| 2022/0045151 A1* | 2/2022 | Jeong | H10K 59/80 |

(Continued)

FOREIGN PATENT DOCUMENTS

| | | |
|---|---|---|
| KR | 10-1243667 B1 | 3/2013 |
| KR | 20190054563 A | 5/2019 |

(Continued)

*Primary Examiner* — Jacob Y Choi
*Assistant Examiner* — Grace Cha
(74) *Attorney, Agent, or Firm* — CANTOR COLBURN LLP

(57) ABSTRACT

A display device includes a substrate including a light emission area, a light transmission area, and a boundary between the light emission area and the light transmission area, and in the light emission area, each of a circuit layer including transistors each comprising a semiconductor pattern and a gate, inorganic insulation layers on the semiconductor pattern and the gate, a light emission element on the plurality of inorganic insulation layers and connected to the circuit layer, the inorganic insulation layers respectively defining inclined side surfaces corresponding to the boundary, and among the transistors, a boundary transistor closest to the boundary. The semiconductor pattern and the gate of the boundary transistor are each inclined along the inclined side surfaces of the plurality of inorganic insulation layers.

20 Claims, 10 Drawing Sheets

(56) References Cited

U.S. PATENT DOCUMENTS

| | | | | |
|---|---|---|---|---|
| 2022/0069021 | A1* | 3/2022 | Kim | G09G 3/3233 |
| 2022/0140014 | A1* | 5/2022 | Shim | H10K 59/126 |
| | | | | 257/40 |

FOREIGN PATENT DOCUMENTS

| | | | |
|---|---|---|---|
| KR | 1020200063739 | A | 6/2020 |
| KR | 20210022818 | A | 3/2021 |
| KR | 1020210130906 | A | 11/2021 |
| KR | 20220064480 | A | 5/2022 |
| KR | 1020220074588 | A | 6/2022 |
| KR | 20220092014 | A | 7/2022 |

* cited by examiner

DR3
DR1
DR2
PDL
HA
EAP
NLRE
LRE
NLRE
EP
CE
ECL
EML
HCL
AE
CH5
CH4
CH1
PX_OP
CNE2
CNE1
CNE1
CH2
CNE1
CH3
CNE1
CNE2
CNE
TA
NTA
SUB
BDT
D4
G4
A4
S4
T4
SMP3
D3
G3
A3
S3
T3
SMP2
SMP1
D6
G6
A6
S6
T6
TFE
PDL
INS7
INS6
INS5
INS4
INS3
INS2
INS1
BFL
BRL

Figure 11:
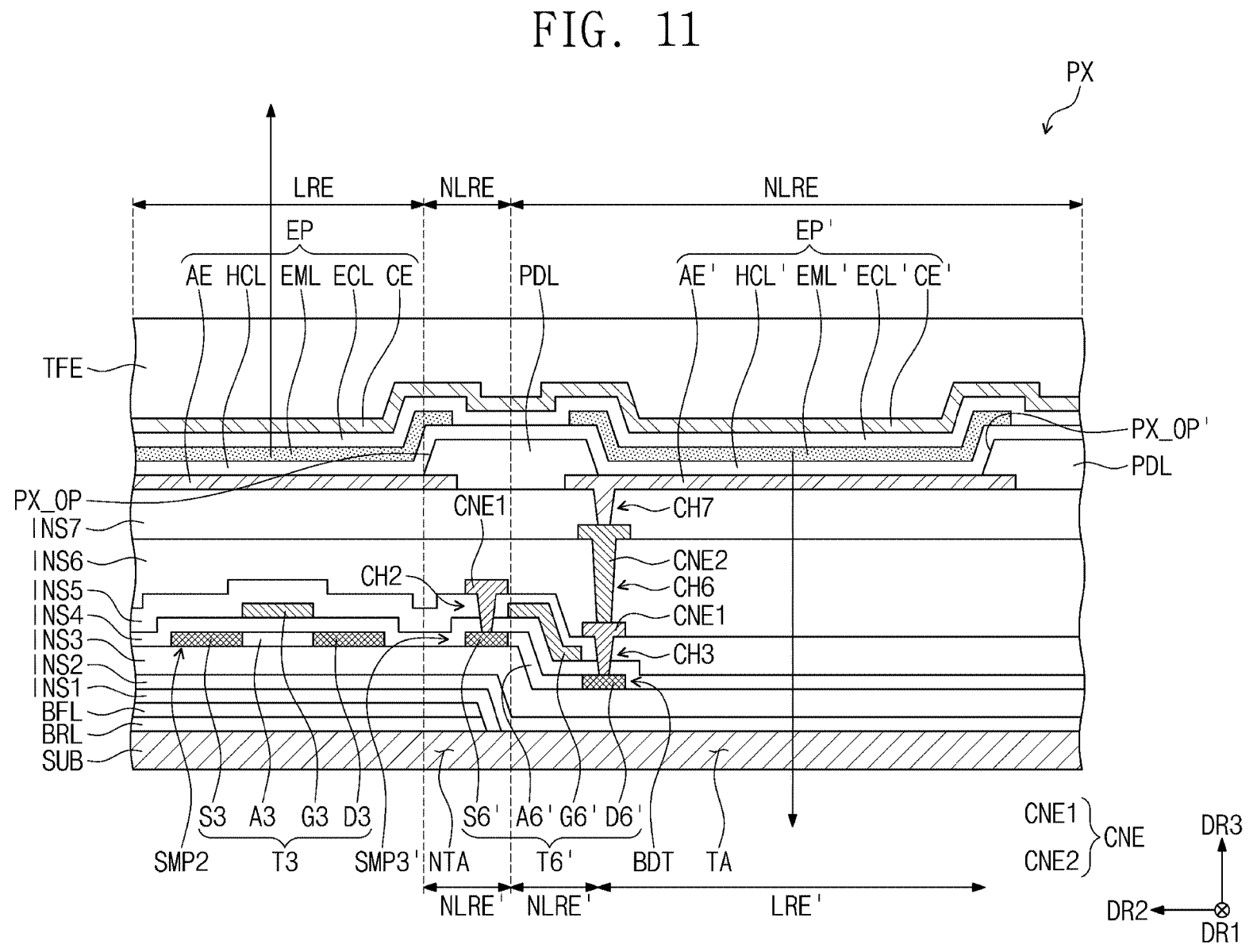

NLRE NLRE LRE

EP' AE' HCL' EML' ECL' CE'

EP AE HCL EML ECL CE

PX_OP' PDL

PDL CNE1 CH2 CH7 CNE2 CH6 CNE1 CH3

S3 A3 G3 D3 T3 SMP2 SMP3' NTA S6' A6' G6' D6' T6' BDT TA

NLRE' NLRE' LRE'

TFE PX_OP INS7 INS6 INS5 INS4 INS3 INS2 INS1 BFL BRL SUB

CNE1 CNE2 CNE

DR3 DR1 DR2

LIGHT TRANSMISSION AREA AND DISPLAY DEVICE HAVING THE SAME

This application claims priority to Korean Patent Application No. 10-2022-0145946, filed on Nov. 4, 2022, and all the benefits accruing therefrom under 35 U.S.C. § 119, the entire contents of which are hereby incorporated by reference.

BACKGROUND

(1) Field

The present disclosure herein relates to a display device.

(2) Description of the Related Art

An electronic device which provides images to a user, such as a smart phone, a digital camera, a notebook computer, a navigation game, and a smart television, includes a display device for displaying the images. The display device generates images, and provides the images to a user through a display screen.

With technology development of display devices, display devices of various shapes such as transparent display devices are being developed. A transparent display device may include a transparent display panel. The transparent display panel may include a plurality of pixels and a plurality of transmission regions. Images are display by the pixels, and the transmission regions may transmit light. The light transmittance of the transmission regions may be higher than the light transmittance of the pixels. An object disposed on a rear surface of the display device may be visually recognized from a front surface of the display device by the transmission regions.

SUMMARY

The present disclosure provides a display device with improved transmittance.

An embodiment of the invention provides a display device including a substrate having a light emission unit and a transmission unit adjacent to the light emission unit, a plurality of transistors disposed on the light emission unit, and each including a semiconductor pattern and a gate, a plurality of inorganic insulation layers covering the semiconductor pattern and the gate on the light emission unit, and a light emission element overlapping the light emission unit, and disposed on the inorganic insulation layers to be connected to the transistors, where the inorganic insulation layers have inclined surfaces on the light emission unit adjacent to a boundary between the light emission unit and the transmission unit, and the transistors include at least one boundary transistor adjacent to the boundary, and a portion of the gate of the boundary transistor and a portion of the semiconductor pattern of the boundary transistor are disposed to be inclined along the inclined surfaces.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 9 is a cross-sectional view of a pixel according to an embodiment of the invention;

FIG. 11 is a cross-sectional view of a pixel according to an embodiment of the invention.

DETAILED DESCRIPTION

Figure 1:
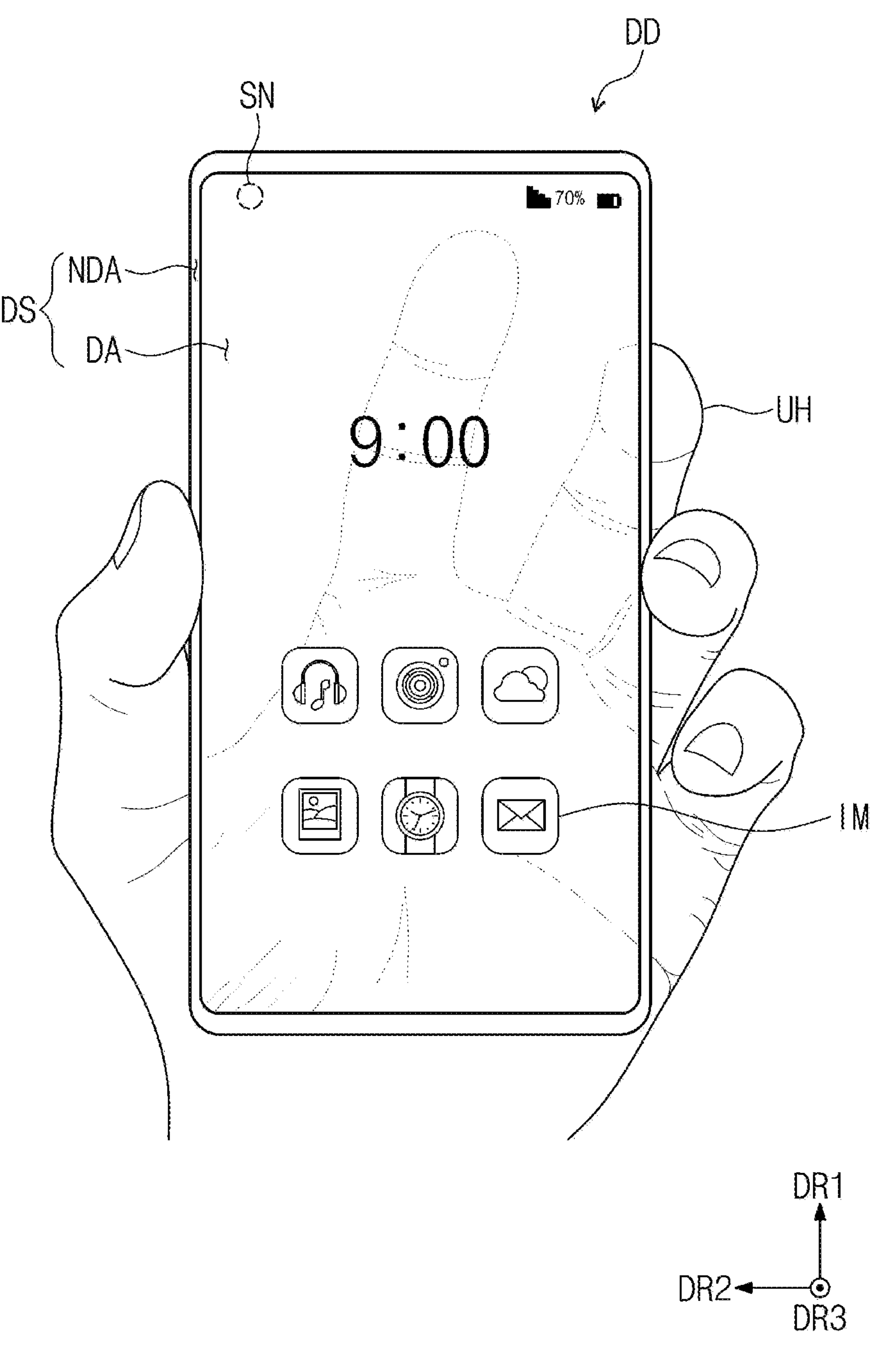
FIG. 1 is a perspective view of a display device according to an embodiment of the invention.

Advantages and features of the invention, and implementation methods thereof will be clarified through following embodiments described with reference to the accompanying drawings. The invention may, however, be embodied in different forms and should not be construed as limited to the embodiments set forth herein. Rather, these embodiments a are provided so that this disclosure will be thorough and complete, and will fully convey the scope of the invention to those skilled in the art to which the invention pertains. The invention will only be defined by the appended claims. Like reference numerals refer to like elements throughout the specification.

When an element or layer is referred to as being related to another element such as being "on" another element or layer, it can be directly on another element or layer, or intervening elements or layers may also be present. On the other hand, when an element is referred to as being related to another element such as being "directly on" or "right above", it indicates that no other element or layer is interposed therebetween.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" may include any and all combinations of one or more of the associated listed items. Within the Figures and the text of the disclosure, a reference number indicating a singular form of an element and may also be used to reference a plurality of the singular element.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms "below," "beneath," "lower," "above," "upper," and the like may be used to easily describe the correlation between one element or components and another element or other component as illustrated in the drawings. The spatially relative terms should be understood as terms encompassing different orientations of elements in use or operation in addition to orientations illustrated in the drawings.

Although first, second, and the like are used to describe various elements, components, and/or sections, it should be understood that these elements, components, and/or sections are not limited by these terms. These terms are only used to distinguish one element, component, or section from another element, component, or section. Therefore, it should be understood that a first element, a first component, or a first section mentioned below may be a second element, a second component, or a second section within the technical spirit of the invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein will be described with reference to plan views and cross-sectional views, which are ideal schematic views of the invention. Thus, the embodiments of the invention are not limited to specific forms shown, but are intended to include changes in the form generated by a manufacturing process. Thus, the regions illustrated in the drawings have properties, and the shapes of the regions illustrated in the drawings are intended to exemplify specific shapes of regions of a device and are not intended to limit the scope of the invention. Thus, the regions illustrated in the drawings have properties, and the shapes of the regions illustrated in the drawings are intended to exemplify specific shapes of regions of a device and are not intended to limit the scope of the invention.

Hereinafter, an embodiment of the invention will be described in more detail with reference to the accompanying drawings.

FIG. 1 is a perspective view of a display device DD according to an embodiment of the invention.

Referring to FIG. 1, a display device DD according to an embodiment of the invention may have a rectangular shape which has long sides extending in a first direction DR1, and has short sides extending in a second direction DR2 crossing the first direction DR1. However, the embodiment of the invention is not limited thereto, and the display device DD may have various planar shapes such as a circular shape and a polygonal shape.

Hereinafter, a direction crossing (such as substantially perpendicularly crossing) a plane defined by the first direction DR1 and the second direction DR2 which cross each other, is defined as a third direction DR3. In addition, in the present disclosure, “when viewed on a plane” may be defined as a state viewed in (or along) the third direction DR3. A thickness of the display device DD and various components or layers thereof may be defined along the third direction DR3 (e.g., a thickness direction).

An upper surface of the display device DD may be defined as a display surface DS, and the display surface DS may have (or be in) a plane defined by the first direction DR1 and the second direction DR2. An image IM provided in plural including a plurality of images generated in the display device DD may be provided to outside the display device DD, such as to a user, through the display surface DS.

The display surface DS may include a display region DA and a non-display region NDA which is adjacent to the display region DA, such as being extended around the display region DA in the plan view. The display region DA may display the image IM, and the non-display region NDA may not display the image IM. In an embodiment, the non-display region NDA surrounds the display region DA, and may define an outer edge or periphery of the display device DD printed in a predetermined color.

Although not illustrated, the display surface DS may be further defined on (or at) a rear surface of the display device DD. In this case, the image IM may also be displayed on the rear surface of the display device DD.

The user may not only visually recognize the image IM displayed on the display surface DS, but also visually recognize an object or an image positioned at the rear of the display device DD. As an example, as illustrated in FIG. 1, an user’s hand UH positioned at the rear of the display device DD may be visually recognized together with recognition of the image IM at the front of the display device DD, from a same position at the front of the display device DD.

The display device DD may include at least one sensor region SN. The sensor region SN may be adjacent to the edge of the display device DD. The sensor region SN may be disposed in a portion of the display region DA which is adjacent to (or close to) the non-display region NDA. Various components or layers of the display device DD may include a display region DA, a non-display region NDA, a sensor region SN, etc. respectively corresponding to those described above.

Although not illustrated, external light as an external input from outside the display device DD may pass through the sensor region SN, and provided to a sensor disposed below the sensor region SN such as within the display device DD. For example, the sensor may be a near-illuminance sensor, but the type of the sensor as a functional component is not limited thereto, and the sensor may be another type of sensor such as an adjacent sensor which provides a function to the display device DD by using the external input. The sensor may be provided in plurality.

Figure 2:
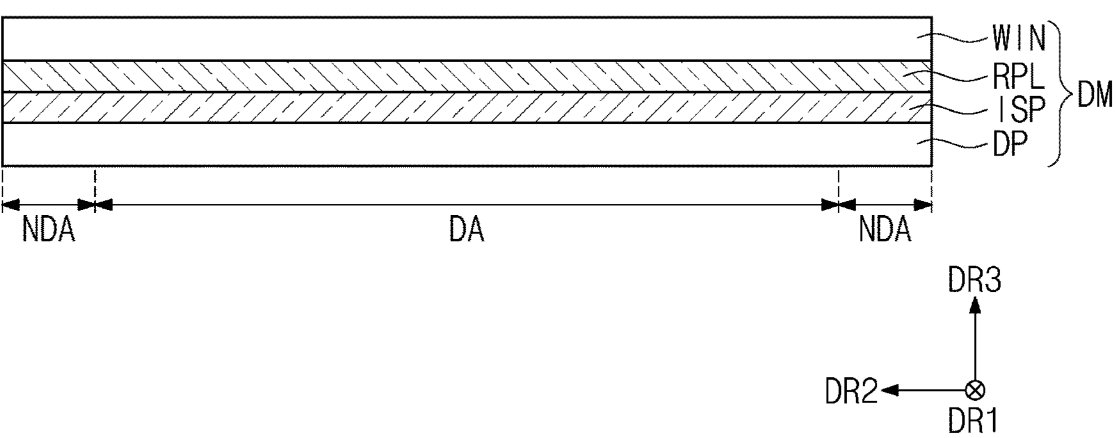
FIG. 2 is a schematic cross-sectional view of a display module.

FIG. 2 is a schematic cross-sectional view of a display module DM.

Although not illustrated in FIG. 1, a display module DM of FIG. 2 may be included in the display device DD of FIG. 1 such that the display device DD includes the display module DM.

Referring to FIG. 2, the display module DM may include a display panel DP, an input sensing unit ISP as an input sensing panel or layer, a reflection prevention layer RPL, and a window WIN.

The display panel DP may be transparent or light-transmissive. Illustratively, the display panel DP of FIG. 2 may be a light emission type display panel, but is not particularly limited thereto. For example, the display panel DP may be an organic light emission display panel or an inorganic light emission display panel. A light emission layer of in the organic light emission display panel may include an organic light emission material. A light emission layer of the inorganic light emission display panel may include a quantum dot, a quantum load, and the like. Hereinafter, the display panel DP will be described as the organic light emission display panel.

The input sensing unit ISP may be disposed on the display panel DP. The input sensing unit ISP may include a plurality of sensors (not shown) for sensing external inputs to the input sensing layer or the display device DD, in a capacitive manner. The input sensing unit ISP may be manufactured (or provided) directly on the display panel DP when manufacturing (or providing) the display module DM. However, the embodiment of the invention is not limited thereto, and the input sensing unit ISP may be manufactured as a separate panel from the display panel DP, and be attached to the display panel DP by a separate element such as an adhesive layer.

The reflection prevention layer RPL may be disposed on the input sensing unit ISP. The reflection prevention layer RPL may be formed (or provided) directly on the input sensing unit (ISP) or may be coupled to the input sensing unit (ISP) by an intervening element such as an adhesive layer. The reflection prevention layer RPL may be defined as an external light reflection prevention film. The reflection prevention layer RPL may reduce the reflectance of external light incident from above or outside of the display device DD and traveling toward the display panel DP.

When the external light incident toward the display panel DP reflects from (or by) the display panel DP and provided again to the outside such as to an external user, like a mirror, the external light may be visually recognized. In order to prevent the above phenomenon, illustratively, the reflection prevention layer RPL may include a plurality of color filters displaying the same color as pixels PX shown in FIG. 5 of the transparent display panel DP.

Figure 5:
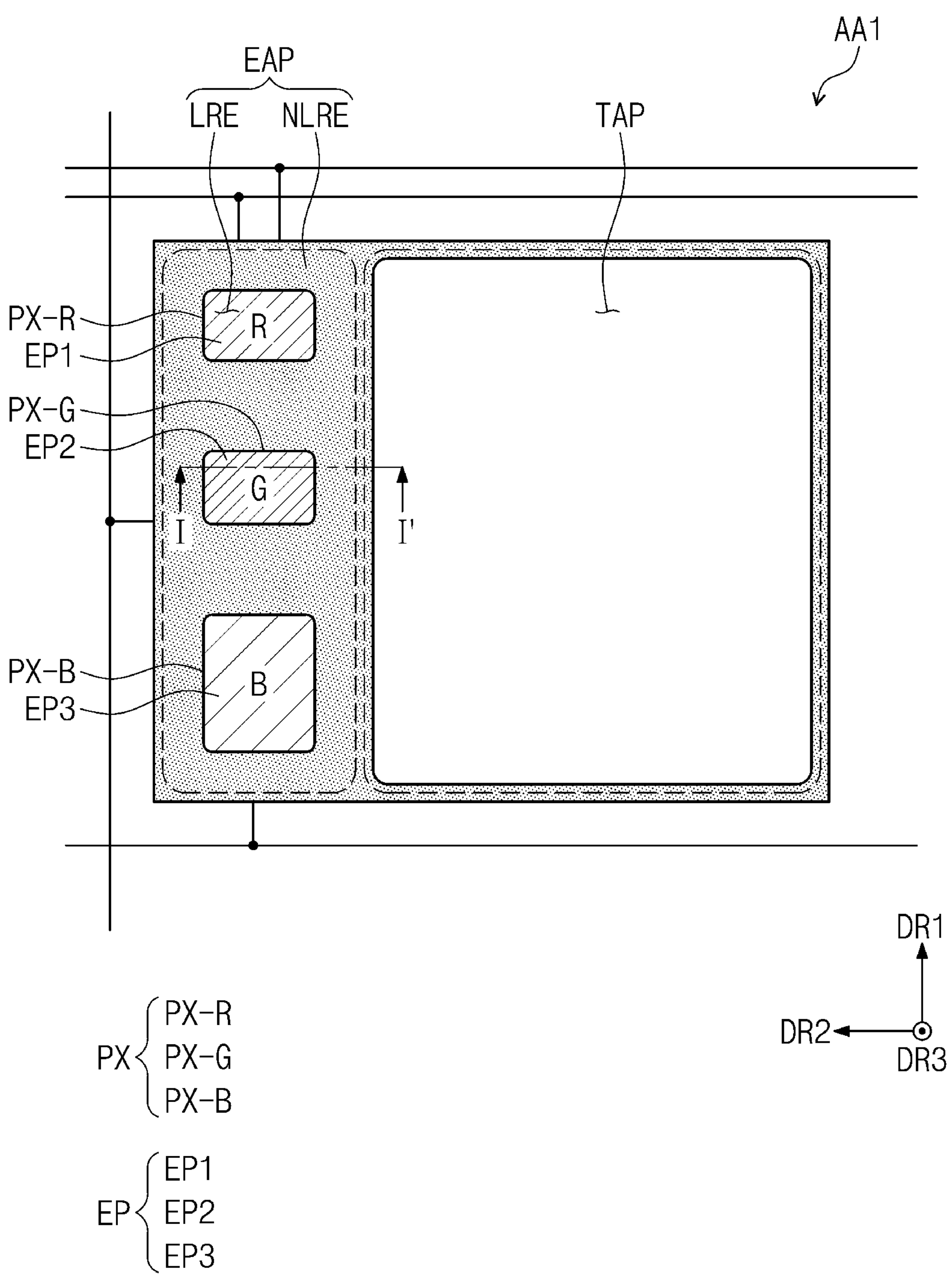
FIG. 5 is an enlarged plan view of first region AA1.

The color filters may filter the external light to the same color as the pixels PX shown in FIG. 5. In this case, the external light may not be visually recognized by the user or from a position external to the display device DD. However, the embodiment of the invention is not limited thereto, and the reflection prevention layer RPL may include a polarizing film for reducing the reflectance of the external light. The polarizing film may include a phase retarder and/or a polarizer.

The window WIN may be disposed on the reflection prevention layer RPL. The window WIN may be formed directly on the reflection prevention layer RPL or may be coupled to the reflection prevention layer RPL by a separate element such as an adhesive layer. The window WIN may protect the transparent display panel DP, the input sensing unit ISP, and the reflection prevention layer RPL from external scratches and impacts.

Figure 3:
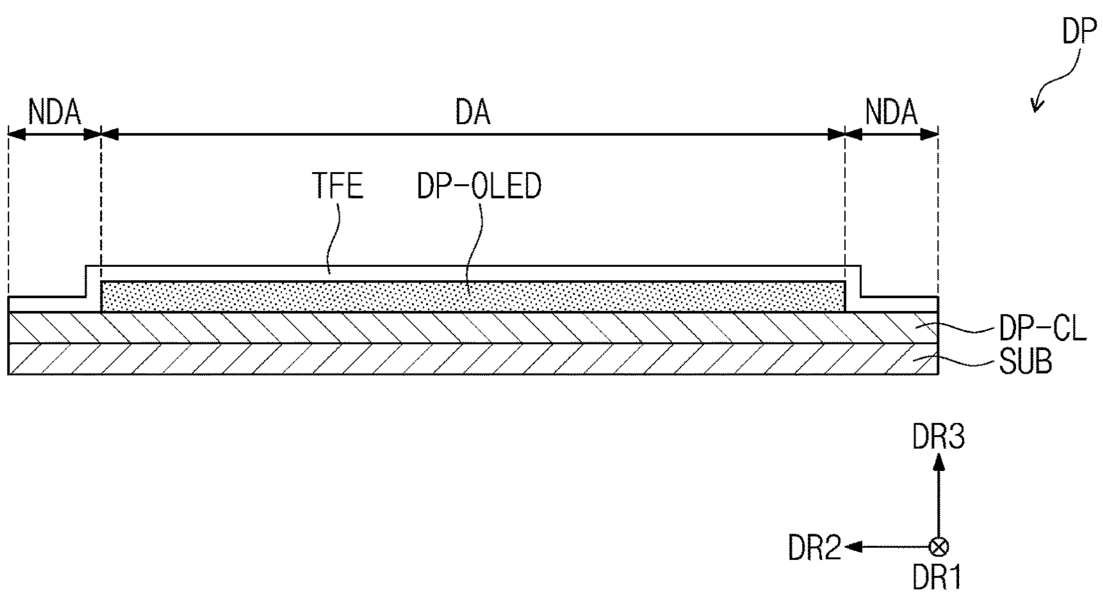
FIG. 3 is a view exemplarily illustrating a cross-section of a display panel illustrated in FIG. 2.

FIG. 3 is a view exemplarily illustrating a cross-section of a display panel DP illustrated in FIG. 2.

Illustratively, FIG. 3 illustrates a cross-section of the display panel DP viewed from the second direction DR2.

Referring to FIG. 3, the display panel DP includes a substrate SUB, a circuit element layer DP-CL as a circuit layer disposed on the substrate SUB, a display element layer DP-OLED disposed on the circuit element layer DP-CL, and a thin film encapsulation layer TFE as an encapsulation layer disposed on the display element layer DP-OLED.

The substrate SUB may include a display region DA and a non-display region NDA around the display region DA, adjacent to the display region DA, etc. The substrate SUB may include a flexible plastic material such as glass or polyimide (PI). The display element layer DP-OLED may be disposed on the display region DA.

A plurality of pixels PX shown in FIG. 5 may be disposed in the circuit element layer DP-CL and the display element layer DP-OLED. Each of the pixels PX may include a transistor disposed in the circuit element layer DP-CL and a light emission element EP shown in FIG. 5 which is disposed in the display element layer DP-OLED and connected to the transistor. That is, the circuit element layer DP-CL is connected to the display element layer DP-OLED. The configuration of a pixel PX will be described in detail with reference to FIG. 7.

The thin film encapsulation layer TFE may be disposed on the circuit element layer DP-CL to cover the display element layer DP-OLED. The thin film encapsulation layer TFE may protect the pixels PX from moisture, oxygen, and a foreign material.

Figure 4:
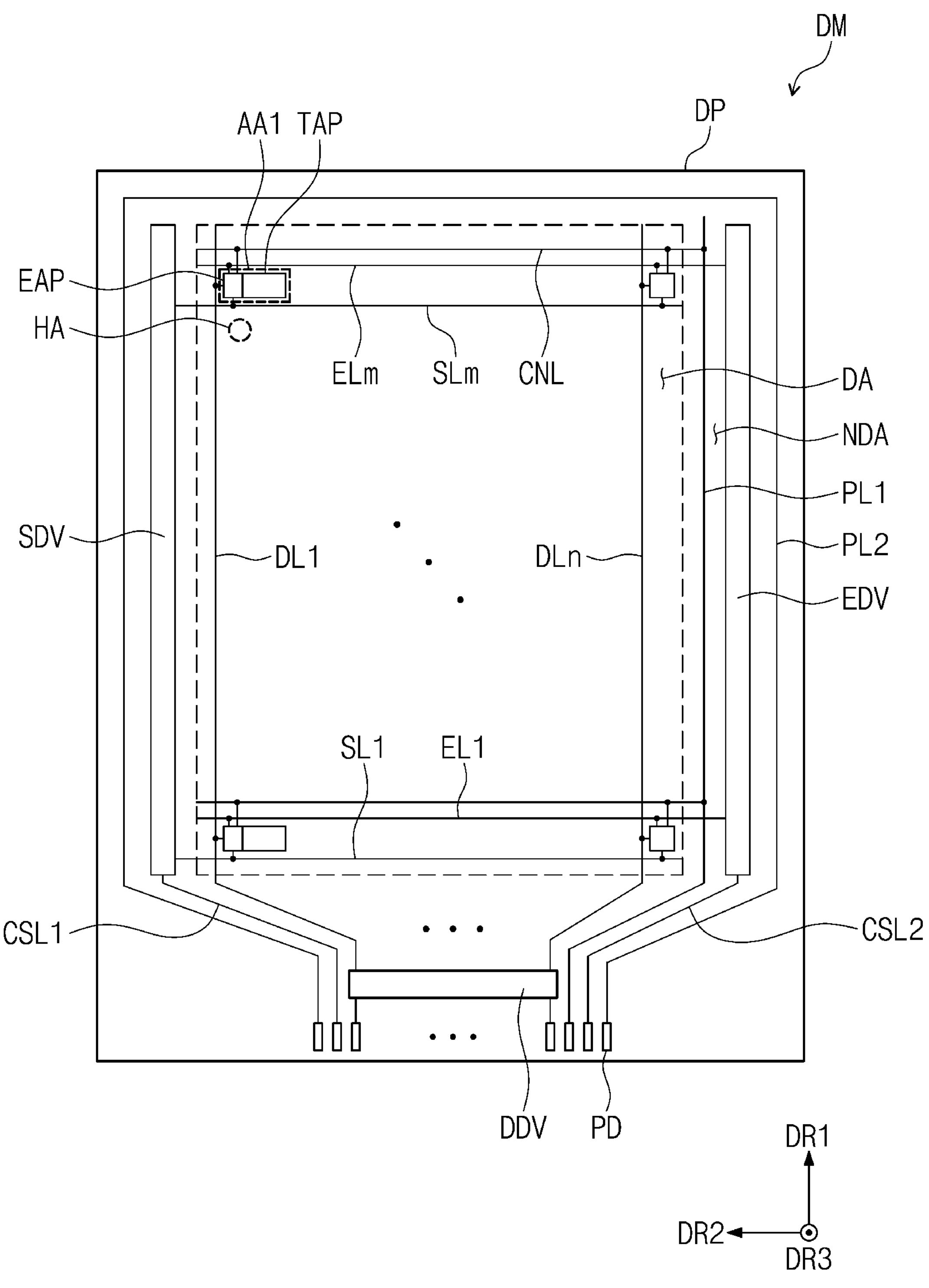
FIG. 4 is a plan view of a display panel.

FIG. 4 is a plan view of a display panel DP of the display module DM.

Referring to FIG. 4, the display module DM may include the display panel DP, the scan driver SDV, the data driver DDV, the light emission driver EDV, and ding a plurality of pads PD.

The display panel DP may have a rectangular shape (e.g., a planar shape of a rectangle) which has long sides extending in the first direction DR1, and short sides extending in the second direction DR2, but the planar shape of the display panel DP is not limited thereto. The display panel DP may include the display region DA and the non-display region NDA which surrounds the display region DA.

A hole region HA may be defined in or by the display panel DP. The hole region HA may be transparent. The hole region HA may overlap (or correspond to) the sensor region SN of FIG. 1. Although not illustrated, the sensor may be disposed below, aligned with, corresponding to, etc. the hole region HA. The sensor may be provided with light as an external input which has passed through the hole region HA. The sensor and the hole region HA will be described in detail with reference to FIG. 10.

The display panel DP may include a plurality of light emission regions EAP, a plurality of transmission regions TAP, a plurality of scan lines SL1 to SLm, a plurality of data lines DL1 to DLn, a plurality of light emission lines EL1 to Elm, first and second control lines CSL1 and CSL2, first and second power lines PL1 and PL2, and a plurality of connection lines CNL. Herein, 'm' and 'n' are natural numbers.

The light emission regions EAP and the transmission regions TAP may be disposed in the display region DA. The light emission regions EAP and the transmission regions TAP may be arranged in the first direction DR1 and the second direction DR2. The light emission regions EAP and the transmission regions TAP will be described in detail with reference to FIG. 5.

The scan driver SDV and the light emission driver EDV may be disposed in portions of the non-display region NDA which are adjacent to each of the long sides of the display panel DP. The data driver DDV may be disposed in a portion of the non-display region NDA which is adjacent to any one short side of the short sides of the display panel DP. When viewed on a plane, the data driver DDV may be adjacent to a lower end of the display panel DP in the plan view.

The scan lines SL1 to SLm may be extended in the second direction DR2 (e.g., have a major dimension along the second direction DR2) and be connected to the light emission regions EAP and the scan driver SDV. The data lines DL1 to DLn may be extended in the first direction DR1 and be connected to the light emission regions EAP and the data driver DDV. The light emission lines EL1 to ELm may be extended in the second direction DR2 and be connected to the light emission regions EAP and the light emission driver EDV.

The first power line PL1 may extend in the first direction DR1 and be disposed on the non-display region NDA. The first power line PL1 may be disposed between the display region DA and the light emission driver EDV, but an embodiment of the invention is not limited thereto. The first power line PL1 may be disposed between the display region DA and the scan driver SDV.

The connection lines CNL may extend in the second direction DR2, be arranged in the first direction DR1, and be connected to the first power line PL1 and the emission regions EAP. A first voltage may be applied to the emission regions EAP through the first power line PL1 and the connection lines CNL which are connected to each other.

The second power line PL2 may be disposed in the non-display region NDA and may extend along the long sides of the display panel DP and another short side of the display panel DP at which the data driver DDV is not disposed. The second power line PL2 may be disposed outside of the scan driver SDV and the light emission driver EDV, such as to be closer to an outer edge of the display panel DP than the respective drivers.

Although not illustrated, the second power line PL2 may extend toward the display region DA and be connected to the emission regions EAP. A second voltage having a lower level than the first voltage may be applied to the emission regions EAP via the second power line PL2.

A first control line CSL1 may be connected to the scan driver SDV, and may be extended toward a lower end of the display panel DP. A second control line CSL2 may be connected to the light emission driver EDV, and may be extended toward the lower end of the display panel DP. The data driver DDV may be disposed between the first control line CSL1 and the second control line CSL2.

The data lines DL1 to DLn may be connected to corresponding pads PD among the plurality of pads PD, through the data driver DDV. For example, the data lines DL1 to DLn may be connected to the data driver DDV, and the data driver DDV may be connected to the pads PD respectively corresponding to the data lines DL1 to DLn.

The data lines DL1 to DLn may be connected to the data driver DDV, and the data driver DDV may be connected to the pads PD corresponding to the data lines DL1 to DLn.

Although not illustrated, a component of the display device DD which is external to the display panel DP such as a printed circuit board may be connected to the display panel DP at the pads PD, and a timing controller and a voltage generator may be disposed on the printed circuit board. The timing controller may be manufactured as an integrated circuit chip and mounted on the printed circuit board. The timing controller and the voltage generator may be connected to the display panel DP at the pads PD, through the printed circuit board.

A scan control signal may be provided to the scan driver SDV through the first control line CSL1. A light emission control signal may be provided to the light emission driver EDV through the second control line CSL2. A data control signal may be provided to the data driver DDV. The timing controller receives image signals from the outside, and may convert the data format of the image signals to match interface specifications with the data driver DDV and provide the image signals with converted data format to the data driver DDV.

The scan driver SDV may generate a plurality of scan signals in response to the scan control signal. The scan signals may be applied to the light emission regions EAP through the scan lines SL1 to SLm. The scan signals may be sequentially applied to the light emission regions EAP.

The data driver DDV may generate a plurality of data voltages corresponding the image signals in response to the data control signal. The data voltages may be applied to the light emission regions EAP through the data lines DL1 to DLn. The light emission driver EDV may generate a plurality of light emission signals in response to the light emission control signal. The light emission signals may be applied to the light emission regions EAP through the light emission lines EL1 to ELm.

The light emission regions EAP may be provided with the data voltages in response to the scan signals. The light emission regions EAP may generate and/or display an image by emitting light of luminance corresponding to the data voltages in response to the light emission signals. The light emission duration of the light emission regions EAP may be controlled by the light emission signals.

FIG. 5 is a plan view of an enlarged first region AA1 in FIG. 4.

As an example, in FIG. 5, one light emission region EAP and one transmission region TAP are illustrated together.

For convenience of description, hereinafter, one light emission region EAP and one transmission region TAP will be described.

Referring to FIG. 4 and FIG. 5, the display panel DP may include the light emission region EAP and the transmission region TAP. The light emission region EAP and the transmission region TAP which are adjacent to each other may be arranged in (or along) the second direction DR2.

In the light emission region EAP, a plurality of pixels PX may be disposed. Illustratively, in the light emission region EAP, one first light emission pixel PX-R, one second light emission pixel PX-G, and one third light emission pixel PX-B may be disposed. That is, each of the plurality of pixels PX may include a sub-pixel (e.g., a respective light emission pixel), such that the light emission region EAP includes a plurality of pixels PX and a plurality of sub-pixels. However, the embodiment of the invention is not limited thereto, and each of the pixels PX may be plural.

Figure 6:
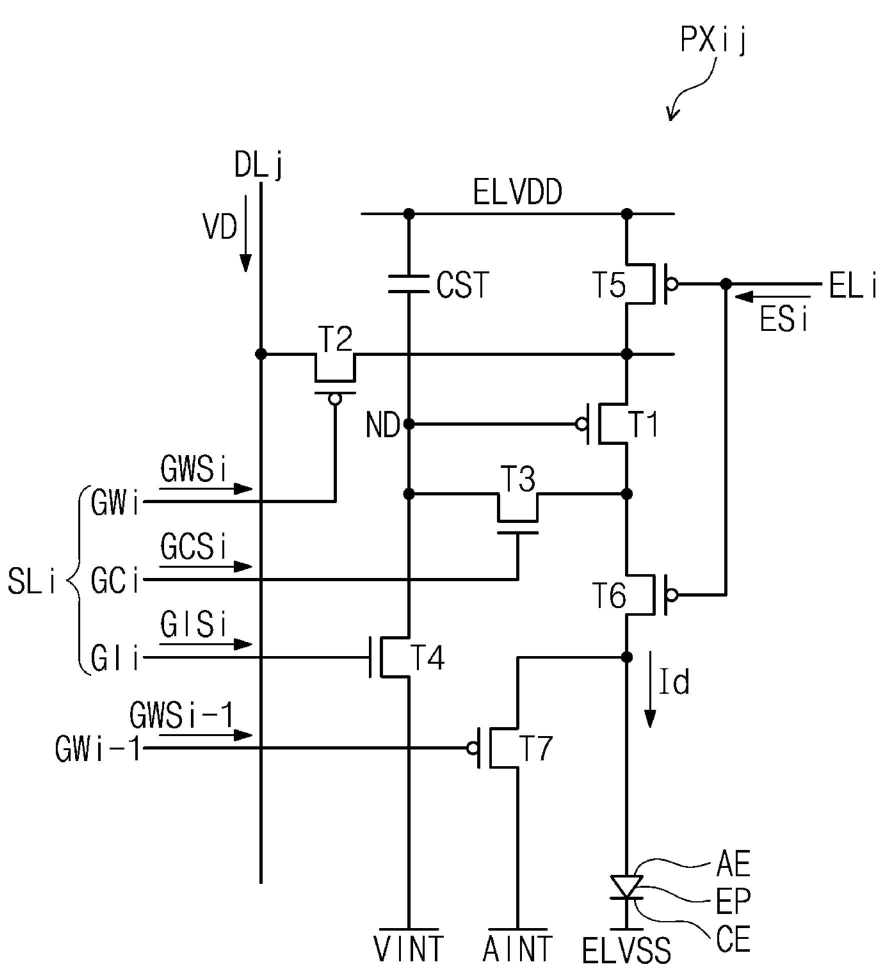
FIG. 6 is a view illustrating an equivalent circuit of one pixel illustrated in FIG. 5.

Each of the pixels PX may include a light emission element EP and a plurality of transistors TR shown in FIG. 6. A first light emission pixel PX-R may include a first light emission element EP1. A second light emission pixel PX-G may include a second light emission element EP2. A third light emission pixel PX-B may include a third light emission element EP3. The first light emission element EP1 may emit red light, the second light emission element EP2 may emit green light, and the third light emission element EP3 may blue light. The connection relationship between the light emission element EP and the transistors TR will be described in detail in FIG. 6 and FIG. 7.

Illustratively, the first, second, and third light emission elements EP1, EP2, and EP3 may be arranged adjacent to each other in the first direction DR1. However, the embodiment of the invention is not limited thereto, and the first, second, and third light emission elements EP1, EP2, and EP3 may be arranged in the second direction DR2 or a diagonal direction inclined with the first direction DR1 or the second direction DR2.

Illustratively, the first, second, and third light emission elements EP1, EP2, and EP3 may have a quadrangular shape (e.g., a planar shape of a quadrangle), but are not limited thereto, and the first, second, and third light emission elements EP1, EP2, and EP3 may have different planar shapes.

The light emission region EAP may include a light emission portion LRE and a non-light emission portion NLRE. The light emission portion LRE may be defined as a total portion or total planar area of the light emission region EAP in which the light emission elements EP are disposed in the light emission region EAP. The non-light emission portion NLRE may be defined as a total region or total planar area of the light emission region EAP in which the light emission elements EP are not disposed in the light emission region EAP. The non-light emission portion NLRE may be adjacent to the light emission portion LRE, such as to surround the light emission portion LRE. A boundary may be defined between the non-light emission portion NLRE, and each of the light emission portions LRE, respectively.

The transmission region TAP may have a quadrangular shape defined by dimensions or portions extending along the first direction DR1 and along the second direction DR2. Illustratively, a first dimension such as a length of the transmission region TAP in the second direction DR2 may be greater than a first dimension such as a length of the light emission region EAP in the second direction DR2. In an embodiment, a second dimension such as a length of the transmission region TAP in the first direction DR1 may be the same as a second dimension such as a length of the light emission region EAP in the first direction DR1. In the transmission region TAP, the light emission elements EP may not be disposed. That is, the light emission elements EP are excluded from the transmission region TAP. The transmission region TAP may be transparent, such as to transmit light incident to the transmission region TAP.

FIG. 6 is a view illustrating an equivalent circuit of one pixel PX illustrated in FIG. 5.

Illustratively, in FIG. 6, among the pixels PX, a pixel PXij connected to an i-th scan line SLi, an i-th light emission line ELi, and a j-th data line DLj are exemplarily illustrated. Herein, 'i' and T are natural numbers.

Referring to FIG. 6, the pixel PXij may include a light emission element EP, a plurality of transistors T1 to T7, and a capacitor CST. The transistors T1 to T7 and the capacitor CST may control the amount of current (e.g., electrical current) flowing into and/or through the light emission element EP. The light emission element EP may generate light and/or emit light with a predetermined luminance according to the amount of current provided.

The i-th scan line SLi may include an i-th write scan line GWi, an i-th compensation scan line GCi, and an i-th initialization scan line GIi. The i-th write scan line GWi may receive an i-th write scan signal GWSi, the i-th compensation scan line may receive an i-th compensation scan signal GCSi, and the i-th initialization scan line GIi may receive an i-th initialization scan signal GISi.

The transistors T1 to T7 may each include a source electrode, a drain electrode, and a gate electrode. Hereinafter, in FIG. 6, any one of the source electrode and the drain electrode is referred to as a first electrode, and the other one thereof is referred to as a second electrode for convenience. In addition, the gate electrode is referred to as a control electrode.

The transistors T1 to T7 may include first to seventh transistors T1 to T7. The first, second, fifth, sixth, and seventh transistors T1, T2, T5, T6, and T7 may include PMOS transistors. The third and fourth transistors T3 and T4 may include NMOS transistors.

A light emission element EP may include an organic light emission element. Light emission elements EP-R, EP-G, and EP-B may include an anode AE and a cathode CE. The anode AE may receive a first voltage ELVDD through the sixth, first, and fifth transistors T6, T1, and T5. The cathode CE may receive a second voltage ELVSS. The first voltage ELVDD may be provided to the pixel PXij through the first power line PL1 described above, and the second voltage ELVSS may be provided to the pixel PXij through the second power line PL2 described above.

The first transistor T1 may be connected between the fifth transistor T5 and the sixth transistor T6. The first transistor T1 may include a first electrode receiving the first voltage ELVDD through the fifth transistor T5, a second electrode connected to the anode AE through the sixth transistor T6, and a control electrode connected to a node ND.

The first electrode of the first transistor T1 may be connected to the fifth transistor T5, and the second electrode of the first transistor T1 may be connected to the sixth transistor T6. The first transistor T1 may control the amount of current flowing in the light emission element EP in accordance with a voltage of the node ND applied to the control electrode of the first transistor T1.

The second transistor T2 may be connected between the data line DLj and the first electrode of the first transistor T1. The second transistor T2 may include a first electrode connected to the data line DLj, a second electrode connected to the first electrode of the first transistor T1, and a control electrode connected to the i-th write scan line GWi.

The second transistor T2 may be turned on by the i-th write scan signal GWSi received through the i-th write scan line GWi and electrically connect the data line DLj and the first electrode of the first transistor T1. The second transistor T2 may perform a switching operation of providing a data voltage VD received through the data line DLj to the first electrode of the first transistor T1.

The third transistor T3 may be connected between the second electrode of the first transistor T1 and the node ND. The third transistor T3 may include a first electrode connected to the second electrode of the first transistor T1, a second electrode connected to the node ND, and a control electrode connected to the i-th compensation scan line GCi.

The third transistor T3 may be turned on by the i-th compensation scan signal GCSi received through the i-th compensation scan line GCi and electrically connect the second electrode of the first transistor T1 and the control electrode of the first transistor T1. When the third transistor T3 is turned on, the first transistor T1 and the third transistor T3 may be connected in a diode form.

The fourth transistor T4 may be connected to the node ND. The fourth transistor T4 may include a first electrode connected to the node ND, a second electrode receiving a first initialization voltage VINT, and a control electrode connected to the i-th initialization scan line GIi. The fourth transistor T4 may be turned on by the i-th initialization scan signal GISi received through the i-th initialization scan line GIi and provide the first initialization voltage VINT to the node ND.

The fifth transistor T5 may include a first electrode configured to receive the first voltage ELVDD, a second electrode connected to the first electrode of the first transistor T1, and a control electrode connected to the i-th light emission line ELi.

The sixth transistor T6 may include a first electrode connected to the second electrode of the first transistor T1, a second electrode connected to the anode AE, and a control electrode connected to the i-th light emission line ELi.

The fifth transistor T5 and the sixth transistor T6 may be turned on by an i-th light emission signal ESi received through the i-th light emission line ELi. The first voltage ELVDD may be provided to the light emission element EP by the turned-on fifth transistor T5 and the sixth transistor T6, so that a driving current may flow in the light emission element EP. Therefore, the light emission element EP may generate and/or emit light.

The seventh transistor T7 may include a first electrode connected to the anode AE, a second electrode configured to receive a second initialization voltage AINT, and a control electrode connected to an i−1-th write scan line GWi−1. The i−1-th write scan line GWi−1 may be defined as a write scan line of a previous stage of the i-th write scan line GWi. The seventh transistor T7 may be turned on by an i-th write scan signal GWSi−1 received through the i−1-th write scan line GWi−1 and provide the second initialization voltage AINT to the anode AE.

In an embodiment of the invention, the seventh transistor T7 may be omitted. In an embodiment of the invention, the second initialization voltage AINT may have a level different from that of the first initialization voltage VINT, but is not limited thereto, and may have the same level as that of the first initialization voltage VINT.

The capacitor CST may include a first capacitor electrode configured to receive the first voltage ELVDD and a second capacitor electrode connected to the node ND. When the fifth transistor T5 and the sixth transistor T6 are turned on, the amount of current flowing in the first transistor T1 may be determined in accordance with a voltage stored in the capacitor CST.

Figure 7:
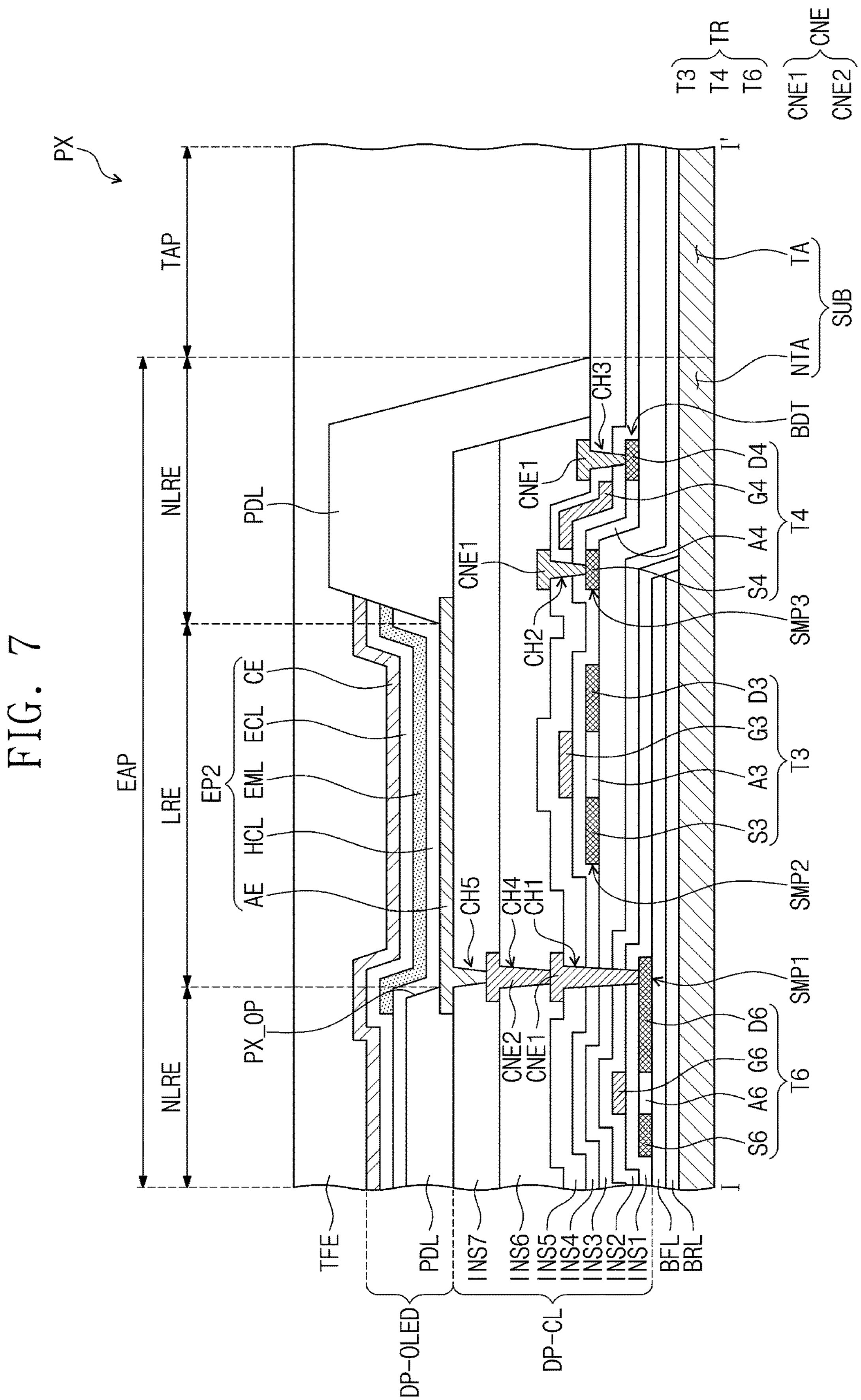
FIG. 7 is a cross-sectional view taken along line I-I' illustrated in FIG. 5.

FIG. 7 is a cross-sectional view taken along line I-I' illustrated in FIG. 5.

Illustratively, FIG. 7 is a cross-sectional view of any one of the pixels PX illustrated in FIG. 5.

Illustratively, FIG. 7 illustrates the third, fourth, and sixth transistors T3, T4 and T6 of FIG. 6.

Referring to FIG. 7, the display panel DP may include a barrier layer BRL, a buffer layer BFL, a circuit element layer DP-CL, a light emission element layer DP-OLED, and a thin film encapsulation layer TFE.

A substrate SUB may include a light emission unit NTA and a transmission unit TA. The transmission unit TA may be disposed adjacent to the light emission unit NTA. The transmission unit TA may be extended from the light emission unit NTA. As used herein, a region, a portion, a unit with reference to emission, non-emission, transmission and the like may also be referred to as an area, where the area may mean a planar area defined by dimensions along the substrate SUB or along the display panel DP.

The light emission unit NTA may overlap (or correspond to) the light emission region EAP. The light emission unit NTA may include the light emission portion LRE and the non-light emission portion NLRE. The transmission unit TA may overlap the transmission region TAP.

The substrate SUB may include a flexible plastic material such as glass or polyimide (PI).

The barrier layer BRL may be disposed on the light emission unit NTA. The barrier layer BRL may not be disposed on the transmission unit TA. As used herein, an element which is not disposed on, does not overlap, etc. relative to another element may be adjacent to the another element in a plan view, may be spaced apart from the another element in the plan view, etc. The barrier layer BRL may be an inorganic layer. The barrier layer BRL may include at least one of aluminum oxide, titanium oxide and silicon oxide. Although not illustrated, the barrier layer BRL may be formed of a plurality of inorganic layers. The barrier layer BRL may have an inclined surface on a substrate SUB adjacent to a boundary between the light emission unit NTA and the transmission unit TA. The inclined surface may be defined by a side surface of the barrier layer BRL.

The buffer layer BFL may be disposed on the barrier layer BRL. The buffer layer BFL may be disposed on the light emission unit NTA. The buffer layer BFL may not be disposed on the transmission unit TA. The buffer layer BFL may be an inorganic layer. The buffer layer BFL may include at least one of aluminum oxide, titanium oxide, silicon oxide, silicon nitride, silicon oxynitride, zirconium oxide and hafnium oxide. Although not illustrated, the buffer layer BFL may be formed of a plurality of inorganic layers. The buffer layer BFL may have an inclined surface on the substrate SUB adjacent to or at the boundary between the light emission unit NTA and the transmission unit TA. The inclined surface may be defined by a side surface of the buffer layer BFL.

On the buffer layer BFL, a first semiconductor pattern SMP1 may be disposed. The first semiconductor pattern SMP1 may be disposed on the light emission unit NTA. The first semiconductor pattern SMP1 may not be disposed on the transmission unit TA. The sixth transistor T6 may be a silicon transistor. The first semiconductor pattern SMP1 may include polysilicon. However, the embodiment of the invention is not limited thereto, and the first semiconductor pattern SMP1 may include amorphous silicon.

The first semiconductor pattern SMP1 may be doped with an N-type dopant or a P-type dopant. The first semiconductor pattern SMP1 may include a high-doping region and a low-doping region. The high-doping region has a greater conductivity than the low-doping region, and may substantially serve as a source electrode and a drain electrode of a transistor TR. The low-doping region may substantially correspond to an active (or a channel) of the transistor.

A source electrode S6, an active A6 as an active region, and a drain electrode D6 of the sixth transistor T6 may be formed from respective portions of the first semiconductor pattern SMP1. The active A6 may be disposed between the source electrode S6 and the drain electrode D6.

A first insulation layer INS1 may be disposed on the first semiconductor pattern SMP1 and the buffer layer BFL. The first insulation layer INS1 may cover the first semiconductor pattern SMP1. The first insulation layer INS1 may overlap the light emission unit NTA. The first insulation layer INS1 may not overlap the transmission unit TA. The first insulation layer INS1 may have an inclined surface on or at a light emission unit NTA adjacent to the boundary between the light emission unit NTA and the transmission unit TA. The first insulation layer INS1 may cover the side surfaces of the buffer layer BFL and the barrier layer BRL. The first insulation layer INS1 may be an inorganic insulation layer. The first insulation layer INS1 may include at least one of aluminum oxide, titanium oxide and silicon oxide.

A gate electrode G6 of the sixth transistor T6 may be disposed on the first insulation layer INS1. The gate electrode G6 may be disposed on the light emission unit NTA. The gate electrode G6 may not be disposed on the transmission unit TA. Although not illustrated, the structures of a source electrode, an active, a drain electrode, and a gate electrode of each of the first, second, fifth, and seventh transistors T1, T2, T5, and T7 of FIG. 6 may be substantially the same as those of the sixth transistor T6.

A second insulation layer INS2 may be disposed on the first insulation layer INS1 to cover the gate electrode G6. The second insulation layer INS2 may overlap the light emission unit NTA. The second insulation layer INS2 may be extended onto the transmission unit TA, and overlap the transmission unit TA. The second insulation layer INS2 may have an inclined surface on the substrate SUB adjacent to the boundary between the light emission unit NTA and the transmission unit TA. The second insulation layer INS2 may cover the inclined surface of the first insulation layer INS1. The second insulation layer INS2 may be an inorganic insulation layer. The second insulation layer INS2 may include at least one of silicon nitride, silicon oxynitride, zirconium oxide and hafnium oxide.

A third insulation layer INS3 may be disposed on the second insulation layer INS2. The third insulation layer INS3 may overlap the light emission unit NTA. The third insulation layer INS3 may be extended from the light emission unit NTA and into the transmission unit TA. The third insulation layer INS3 may overlap the transmission unit TA. The third insulation layer INS3 may have an inclined surface on the light emission unit NTA adjacent to the boundary between the light emission unit NTA and the transmission unit TA. The third insulation layer INS3 may cover the inclined surface of the second insulation layer INS2. The third insulation layer INS3 may be an inorganic layer. The third insulation layer INS3 may include at least one of aluminum oxide, titanium oxide and silicon oxide.

On the third insulation layer INS3, a second semiconductor pattern SMP2 of the third transistor T3 is may be disposed. The third transistor T3 may be disposed higher than the sixth transistor T6, that is, further from the substrate SUB than the sixth transistor T6 in a direction along the thickness direction of the display panel DP. The second semiconductor pattern SMP2 may be disposed on the light emission unit NTA. The second semiconductor pattern SMP2 may not be disposed on the transmission unit TA.

On the third insulation layer INS3, a third semiconductor pattern SMP3 of the fourth transistor T4 is may be disposed. The third semiconductor pattern SMP3 may be disposed on the substrate SUB adjacent to the boundary between the light emission unit NTA and the transmission unit TA. Hereinafter, the fourth transistor T4 may be defined as a boundary transistor BDT.

A third semiconductor pattern SMP3 of the boundary transistor BDT may be disposed on the light emission unit NTA. The third semiconductor pattern SMP3 may not be disposed on the transmission unit TA. A portion of the third semiconductor pattern SMP3 may be disposed inclined along inclined surfaces defined by the barrier layer BRL together with the buffer layer BFL, and the first to third insulation layers INS1 to INS3. That is, a cross-sectional profile of a pattern (e.g., semiconductor patter or gate) of a respective boundary transistor BDT may correspond to or be the same as a cross-sectional profile of a plurality of inorganic layers respectively defining inclined side surfaces thereof.

A source electrode S3, an active A3, and a drain electrode D3 of the third transistor T3 may be formed from the second semiconductor pattern SMP2. The active A3 may be disposed between the source electrode S3 and the drain electrode D3.

A source electrode S4, an active A4, and a drain electrode D4 of the boundary transistor BDT may be formed from the third semiconductor pattern SMP3. The source electrode S4 may be disposed higher than the drain electrode D4. The active A4 may be disposed inclined along inclined surfaces between the source electrode S4 and the drain electrode D4.

The second semiconductor pattern SMP2 and the third semiconductor pattern SMP3 may be oxide transistors. The third transistor T3 and the boundary transistor BDT may include an oxide semiconductor formed of a metal oxide. The oxide semiconductor may include a crystalline or amorphous oxide semiconductor.

The second and third semiconductor patterns SMP2 and SMP3 may include a plurality of regions divided according to whether the metal oxide has been reduced. A region in which a metal oxide is reduced (hereinafter, a reduction region) has greater conductivity than a region in which a metal oxide is not reduced (hereinafter, a non-reduction region). The reduction region may substantially serve as a source electrode or a drain electrode of a transistor. The non-reduction region may substantially correspond to an active (or a channel) of a transistor.

A fourth insulation layer INS4 may be disposed on the third insulation layer INS3 to cover the second and third semiconductor patterns SMP2 and SMP3. The fourth insulation layer INS4 may include an inclined surface on the light emission unit NTA adjacent to the boundary between the light emission unit NTA and the transmission unit TA. The fourth insulation layer INS4 may be an inorganic layer. The fourth insulation layer INS4 may include at least one of aluminum oxide, titanium and silicon oxide.

Gate electrodes G3 and G4 (or control electrodes) of the third transistor T3 and the boundary transistor BDT may be disposed on the fourth insulation layer INS4. A portion of the gate electrode G4 of the boundary transistor BDT may be disposed inclined along inclined surfaces.

A fifth insulation layer INS5 may be disposed on the fourth insulation layer INS4. The fifth insulation layer INS5 may be extended onto the transmission unit TA. The fifth insulation layer INS5 may be disposed on the light emission unit NTA and the transmission unit TA. The fifth insulation layer INS5 may have an inclined surface on the light emission unit NTA adjacent to the boundary between the light emission unit NTA and the transmission unit TA. The fifth insulation layer INS5 may be an inorganic layer. The fifth insulation layer INS5 may include at least one of silicon nitride, silicon oxynitride, zirconium oxide and hafnium oxide. The fifth insulation layer INS5 may cover the gate electrodes G3 and G4 of the third transistor T3 and the boundary transistor BDT. Hereinafter, the first to fifth insulation layers INS1 to INS5 may be defined as inorganic insulation layers.

The second insulation layer INS2, the third insulation layer INS3, the fourth insulation layer INS4, and the fifth insulation layer INS5 may have the same refractive index as that of the substrate SUB. Accordingly, even if external light incident under the transmission unit TA passes through the substrate SUB and the second to fifth insulation layers INS2 to INS5, the light may not be refracted. Therefore, as illustrated in FIG. 1, an object or an image positioned at the rear of the display device DD may be more clearly visually recognized.

In addition, since elements of the boundary transistor BDT are disposed inclined and at different distances from the substrate SUB, the planar area occupied by the boundary transistor BDT may be smaller than the planar area occupied by transistors in which elements thereof are disposed flat or coplanar with each other. Accordingly, the planar area of the transmission unit TA as a light transmission area is increased, so that external light passing through the transmission unit TA may be increased. Accordingly, the light transmittance of the transmission unit TA may be improved.

First connection electrodes CNE1 may be disposed on the fifth insulation layer INS5. Among the first connection electrodes CNE1, a first connection electrode CNE1 disposed on the first semiconductor pattern SMP1 may be connected to the drain D6 through a first contact-hole CH1 defined on the inorganic insulation layers INS1 to INS5. Among the first connection electrodes CNE1, each of first connection electrodes CNE1 disposed on the third semiconductor pattern SMP3 may be connected to the source electrode S4 and the drain electrode D4 through corresponding contact-holes CH2 and CH3 between second and third contact-holes CH2 and CH3.

A sixth insulation layer INS6 may be disposed on the inorganic insulation layers INS1 to INS5. The sixth insulation layer INS6 may be disposed on the fifth insulation layer INS5. The sixth insulation layer INS6 may cover the first connection electrodes CNE1. The sixth insulation layer INS6 may overlap the light emission unit NTA. The sixth insulation layer INS6 may not be disposed on the transmission unit TA. The sixth insulation layer INS6 may have an inclined surface on the light emission unit NTA adjacent to the boundary between the light emission unit NTA and the transmission unit TA. The sixth transistor INS6 may cover the boundary transistor BDT. The sixth insulation layer INS6 may be an organic layer.

A second connection electrode CNE2 may be disposed on the sixth insulation layer INS6. The second connection electrode CNE2 may be connected to the first connection electrode CNE1 through a fourth contact-hole CH4 defined on the sixth insulation layer INS6.

A connection electrode CNE as including the first connection electrode CNE1 together with the second connection electrode CNE2 may be connected to the sixth transistor T6. Although not illustrated, the first to seventh transistors T1 to T7 may be connected to each other. Therefore, the connection electrode CNE may be connected to the first to fifth, and seventh transistors T1 to T5, and T7 through the sixth transistor T6.

A seventh insulation layer INS7 may be disposed on the sixth insulation layer INS6. The seventh insulation layer INS7 may cover the second connection electrode CNE2. The seventh insulation layer INS7 may overlap the light emission unit NTA. The seventh insulation layer INS7 may not be disposed on the transmission unit TA. The seventh insulation layer INS7 may have an inclined surface on the light emission unit NTA adjacent to the boundary between the light emission unit NTA and the transmission unit TA. Hereinafter, the sixth and seventh insulation layers INS6 and INS7 may be defined as organic insulation layers.

The light emission element EP may be disposed on the organic insulation layers INS6 and INS7. The light emission element EP may be disposed on the seventh insulation layer INS7. The light emission element EP may overlap the light emission unit NTA. The light emission element EP may include a first electrode AE, a second electrode CE, a hole control layer HCL, an electron control layer ECL, and a light emission layer EML. The first electrode AE may be the anode AE illustrated in FIG. 6, and the second electrode CE may be the cathode CE illustrated in FIG. 6.

The first electrode AE may be disposed on the seventh insulation layer INS7. The first electrode AE may be electrically connected to the second connection electrode CNE2 through a fifth contact-hole CH5 defined on the seventh insulation layer INS7. Accordingly, the light emission element EP may be connected to the sixth transistor T6. The light emission element EP may be connected to the first to fifth, and seventh transistors T1 to T5, and T7 through the sixth transistor T6. The first electrode AE may include a light reflecting material such as aluminum (Al), silver (Ag), molybdenum (Mo), or titanium (Ti).

A pixel definition film PDL may be disposed on the light emission unit NTA. The pixel definition film PDL may not be disposed on the transmission unit TA. The pixel definition film PDL may have an inclined surface on the light emission unit NTA adjacent to the boundary between the light emission unit NTA and the transmission unit TA. The inclined surface of the pixel definition film PDL may cover the inclined surfaces of the sixth and seventh insulation layers INS6 and INS7.

The pixel definition film PDL as a pixel definition layer may expose a predetermined portion of the first electrode AE and the fifth insulation layer INS5 on the first electrode AE and the seventh insulation layer INS7, to outside the pixel definition film PDL. An opening PX_OP as a first opening for exposing a predetermined portion of the first electrode AE may be defined on the pixel definition film PDL.

The hole control layer HCL may be disposed on the first electrode AE. The hole control layer HCL may be commonly disposed in the light emission portion LRE and the non-light emission portion NLRE. The hole control layer HCL may include a hole transport layer and a hole injection layer.

The light emission layer EML may be disposed on the hole control layer HCL and the first electrode AE. The light emission layer EML may be disposed in a region corresponding to the opening PX_OP. The light emission layer EML may include an organic material and/or an inorganic material. The light emission layer EML may generate light of any one of red, green, and blue colors.

The electron control layer ECL may be disposed on the light emission layer EML and the hole control layer HCL. The electron control layer ECL may be commonly disposed in the light emission portion LRE and the non-light emission portion NLRE. The electron control layer ECL may include an electron transport layer and an electron injection layer.

The second electrode CE may be disposed on the electron control layer ECL. The second electrode CE may be commonly disposed in the pixels PX. The second electrode CE may have a structure formed of a transparent conductive layer. For example, the second electrode CE may include a transparent conductive material such as indium-tin oxide or indium-zinc oxide.

The thin film encapsulation layer TFE may overlap the light emission unit NTA and the transmission unit TA. The thin film encapsulation layer TFE may be disposed on the light emission element EP. The thin film encapsulation layer TFE may be disposed on the fifth insulation layer INS5. The thin film encapsulation layer TFE may include an inorganic layer, an organic layer, and an inorganic layer sequentially laminated. The inorganic layers include an inorganic material, and may protect the pixels PX from moisture/oxygen. The organic layer includes an organic material, and may protect the pixels PX from foreign materials such as dust particles.

Figure 8:
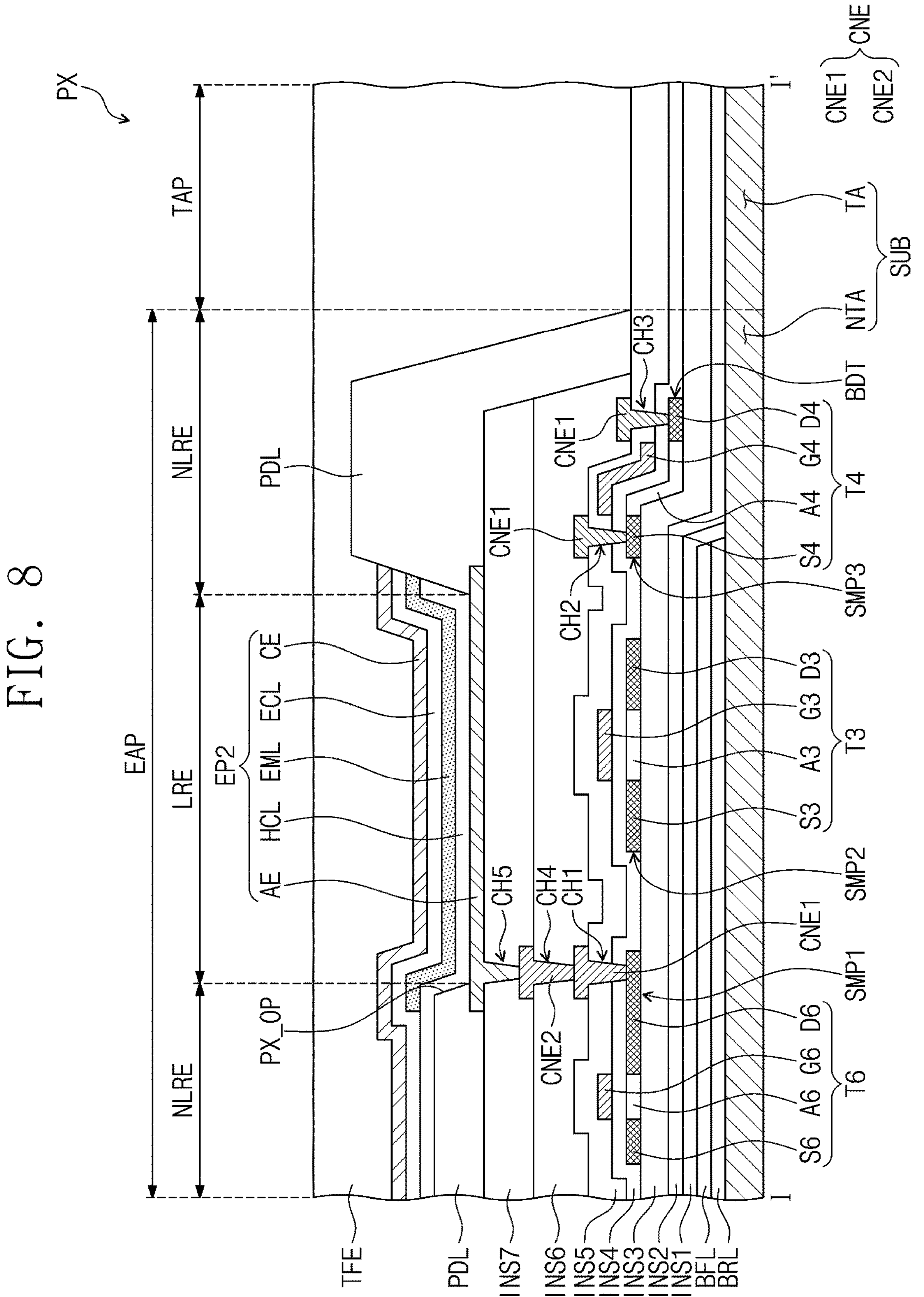
FIG. 8 is a cross-sectional view of a pixel according to an embodiment of the invention.

FIG. 8 is a cross-sectional view of a pixel PX according to an embodiment of the invention.

A substrate SUB, a barrier layer BRL, a buffer layer BFL, a third transistor T3, a boundary transistor T4, first and second insulation layers INS1 and INS2, organic insulation layers INS6 and INS7, and a light emission element EP of FIG. 8 are the same as the substrate SUB, the barrier layer BRL, the buffer layer BFL, the third transistor T3, the boundary transistor T4, the inorganic insulation layers INS1 to INS5, the organic insulation layers INS6 and INS7, and the light emission element EP of FIG. 7, so that descriptions thereof may be omitted or brief.

Illustratively, in FIG. 8, third, fourth, and sixth transistors T3, T4, and T6 are illustrated. In addition, as mentioned above, the fourth transistor T4 may be defined as a boundary transistor BDT.

Referring to FIG. 8, a first semiconductor pattern SMP1, a second semiconductor pattern SMP2, and a third semiconductor pattern SMP3 may be disposed on a third insulation layer INS3. The first, second, and third semiconductor patterns SMP1, SMP2, and SMP3 may be oxide transistors. The first, second, and third semiconductor patterns SMP1, SMP2, and SMP3 may include an oxide semiconductor formed of a metal oxide. The oxide semiconductor may include a crystalline or amorphous oxide semiconductor. Although not illustrated, the first, second, fifth, and seventh transistors T1, T2, T5, and T7 of FIG. 6 may also be oxide transistors.

Referring to FIG. 8, the semiconductor pattern (e.g., the first semiconductor pattern SMP1 or the second semiconductor pattern SMP2) of the light emission area (e.g., the light emission region EAP or the light emission unit NTA) and the semiconductor pattern (e.g., the third semiconductor pattern SMP3) of the light transmission area (e.g., the transmission region TAP or the transmission unit TA) are in a same layer as each other. Referring to FIG. 7, the semiconductor pattern of the light emission area (e.g., the light emission region EAP at the non-light emission region NLRE) and the semiconductor pattern of the transmission area (e.g., the transmission region TAP or the transmission unit TA) are in different layers from each other. As being in a same layer, elements may be formed in a same process and/or as including a same material as each other, elements may be respective portions of a same material layer, elements may be on a same layer by forming an interface with a same underlying or overlying layer, etc., without being limited thereto.

A fourth insulation layer INS4 may be disposed on the third insulation layer INS3 to cover the first, second, and third semiconductor patterns SMP1, SMP2, and SMP3. The fourth insulation layer INS4 may be disposed on a light emission unit NTA. The fourth insulation layer INS4 may be extended onto a transmission unit TA. The fourth insulation layer INS4 may have an inclined surface on the light emission unit NTA adjacent to a boundary between the light emission unit NTA and the transmission unit TA.

On the fourth insulation layer INS4, gate electrodes G3, G4, and G6 may be disposed. Each of the gate electrodes G3, G4, and G6 may be disposed on a corresponding semiconductor pattern among the first, second, and third semiconductor patterns SMP1, SMP2, and SMP3. A portion of the gate electrode G4 disposed on the third semiconductor pattern SMP3 may be disposed inclined along inclined surfaces.

The fifth insulation layer INS5 may be disposed on the fourth insulation layer INS4 to cover the gate electrodes G3, G4, and G6. The fifth insulation layer INS5 may overlap the light emission unit NTA. The fifth insulation layer INS5 may be extended onto the transmission unit TA. The fifth insulation layer INS5 may have an inclined surface on the light emission unit NTA adjacent to the boundary between the light emission unit NTA and the transmission unit TA.

A first connection electrode CNE1 may be disposed on the fifth insulation layer INS5. The first connection electrode CNE1 may be connected to a drain electrode D6 of the sixth transistor T6 through a first contact-hole CH1 defined on the third to fifth insulation layers INS3 to INS5.

Hereinafter, structures of layers disposed on the first connection electrode CNE1 and the fifth insulation layer INS5 illustrated in FIG. 8 are the same as the structures of layers disposed on the first connection electrode CNE1 and the fifth insulation layer INS5 of FIG. 7, so that descriptions thereof will be omitted.

Figure 9:
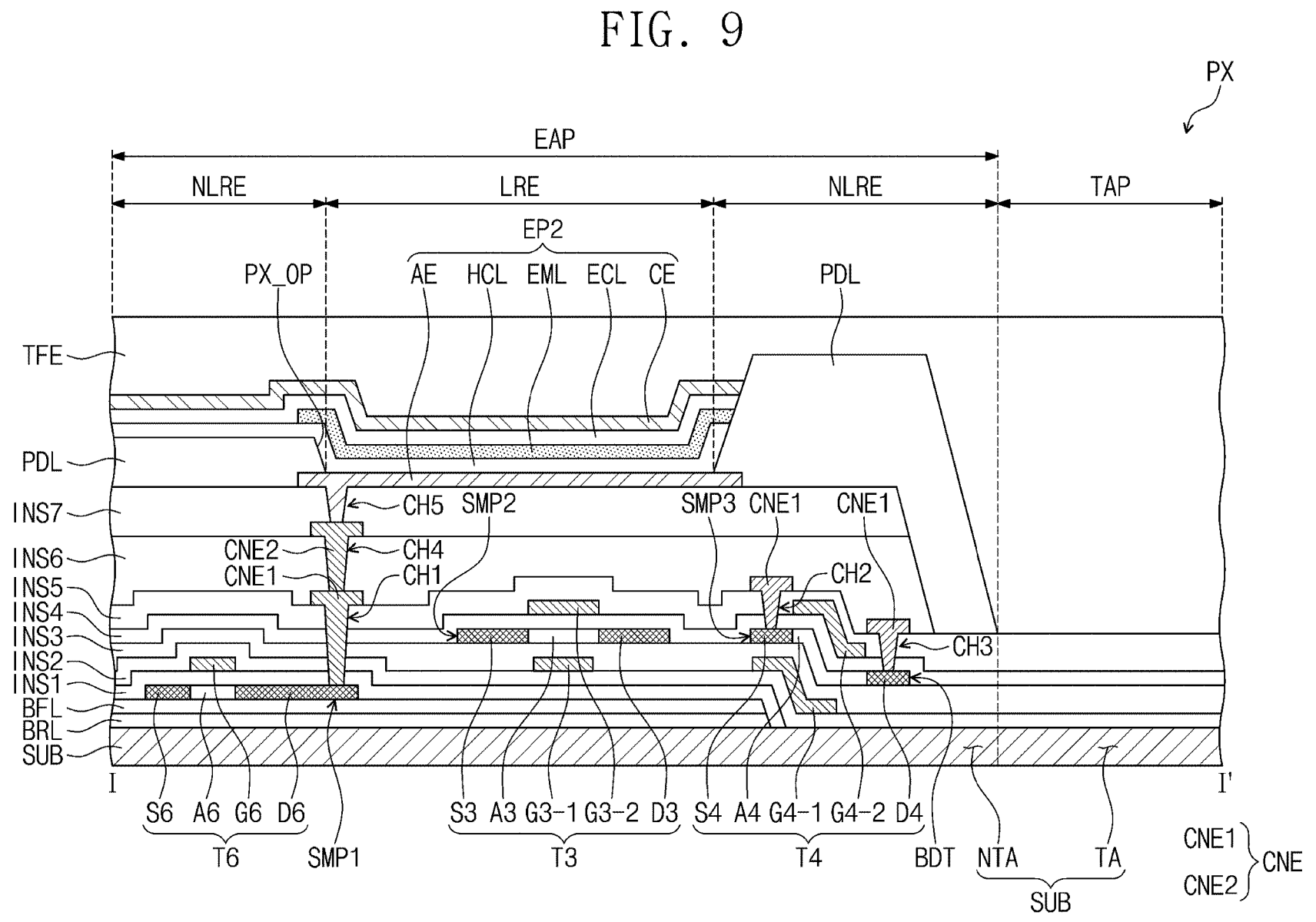

FIG. 9 is a cross-sectional view of a pixel PX according to an embodiment of the invention.

A substrate SUB, a barrier layer BRL, a buffer layer BFL, a sixth transistor T6, a second semiconductor pattern SMP2, a third semiconductor pattern SMP3, inorganic insulation layers INS1 to INS5, organic insulation layers INS6 and INS7, and a light emission element EP of FIG. 9 are the same as the substrate SUB, the barrier layer BRL, the buffer layer BFL, the third transistor T3, the boundary transistor T4, the inorganic insulation layers INS1 to INS5, the organic insulation layers INS6 and INS7, and the light emission element EP of FIG. 7, so that descriptions thereof may be omitted or brief.

Illustratively, the sixth transistor T6 may be a silicon transistor, and third and fourth transistors T3 and T4 may be oxide transistors.

Referring to FIG. 9, each of the third transistor T3 and the boundary transistor BDT may include a plurality of gates among gates G3-1, G3-2, G4-1, and G4-2. Lower gates G3-1 and G4-1 may be disposed on a second insulation layer INS2. The lower gates G3-1 and G4-1 may be defined as gates disposed below than the second and third semiconductor patterns SMP2 and SMP3 among the gates G3-1, G3-2, G4-1, and G4-2 of the third transistor T3 and the boundary transistor BDT, that is, closer to the substrate SUB than gates G3-2 and G4-2. The second and third semiconductor patterns SMP2 and SMP3 may overlap (or correspond to) the lower gates G3-1 and G4-1.

The lower gate G4-1 as a lower gate pattern of the boundary transistor BDT may be disposed on a light emission unit NTA adjacent to a boundary between the light emission unit NTA and a transmission unit TA. A portion of the lower gate G4-1 of the boundary transistor BDT may be disposed inclined along inclined surfaces of the second insulation layer INS2.

A third insulation layer INS3 may be disposed on the second insulation layer INS2 to cover the lower gates G3-1 and G4-1. The third insulation layer INS3 may be extended onto the transmission unit TA. The third insulation layer INS3 may overlap the light emission unit NTA and the transmission unit TA. The third insulation layer INS3 may have an inclined surface on the light emission unit NTA adjacent to the boundary between the light emission unit NTA and the transmission unit TA.

The second and third semiconductor patterns SMP2 and SMP3 may be disposed on the third insulation layer INS3. A fourth insulation layer INS4 may be disposed on the third insulation layer INS3 and the second and third semiconductor patterns SMP2 and SMP3. A portion of the third semiconductor pattern SMP3 may be disposed inclined along inclined surfaces on the light emission unit NTA adjacent to a boundary between the light emission unit NTA and the transmission unit TA.

The fourth insulation layer INS4 may be disposed on the third insulation layer INS3. The fourth insulation layer INS4 may cover the second and third semiconductor patterns SMP2 and SMP3. The fourth insulation layer INS4 may overlap the light emission unit NTA and the transmission unit TA. The fourth insulation layer INS4 may have an inclined surface on the light emission unit NTA adjacent to the boundary between the light emission unit NTA and the transmission unit TA.

Upper gates G3-2 and G4-2 may be disposed on the fourth insulation layer INS4. The upper gates G3-1 and G4-1 may be defined as gates disposed further above than the second and third semiconductor devices SMP2 and SMP3 among the gates G3-1, G3-2, G4-1, and G4-2 of the third transistor T3 and the boundary transistor BDT.

The upper gate G4-2 as an upper gate pattern of the boundary transistor BDT may be disposed on the light emission unit NTA adjacent to the boundary between the light emission unit NTA and the transmission unit TA. A portion of the upper gate G4-2 of the boundary transistor BDT may be disposed inclined along inclined surfaces.

Hereinafter, structures of layers disposed on the upper gates G3-2 and G4-2 and the fourth insulation layer INS4 are the same as the structures of layers disposed on the gates G3 and G4 of FIG. 7, so that descriptions thereof will be omitted.

Figure 10:
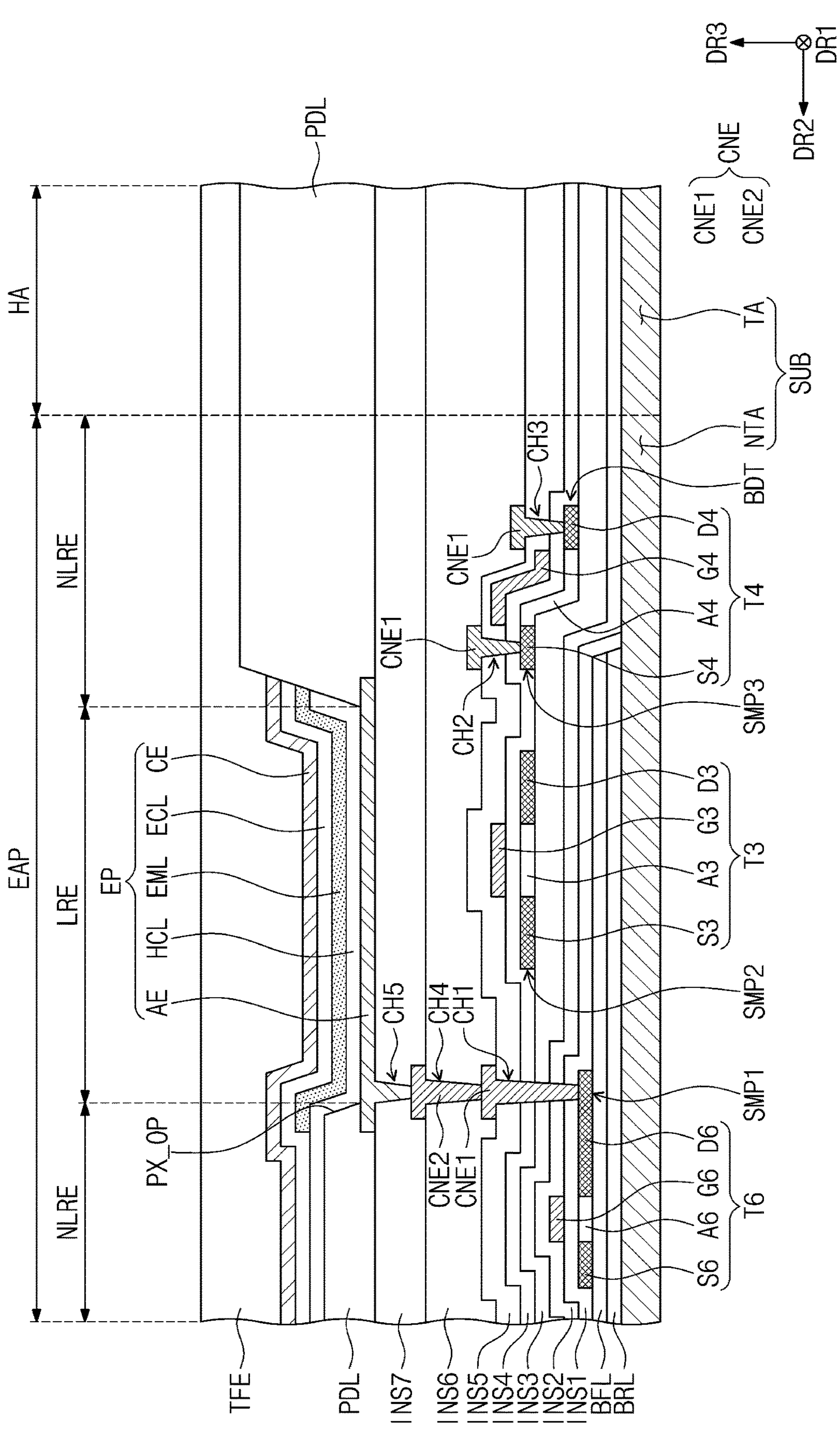
FIG. 10 is a cross-sectional view of a hole region of FIG. 4.

FIG. 10 is a cross-sectional view of a hole region HA of FIG. 4.

Illustratively, FIG. 10 is a cross-sectional view of a line parallel to the second direction DR2 in the hole region HA. The horizontal direction of FIG. 10 may extend along the second direction DR2 while the vertical direction extends along the third direction DR3, such that FIG. 10 is a view along the first direction DR1.

Illustratively, in FIG. 10, third and fourth transistors T3 and T4 are illustrated.

A substrate SUB, a barrier layer BRL, a buffer layer BFL, second and third semiconductor patterns SMP2 and SMP3, inorganic insulation layers INS1 to INS5, a light emission element EP, first connection electrodes CNE1, and a thin film encapsulation layer TFE of FIG. 10 are the same as the substrate SUB, the barrier layer BRL, the buffer layer BFL, the second and third semiconductor patterns SMP2 and SMP3, the inorganic insulation layers INS1 to INS5, the light emission element EP, the first connection electrodes CNE1, and the thin film encapsulation layer TFE of FIG. 7, so that descriptions thereof may be omitted or brief.

Referring to FIG. 10, a sixth insulation layer INS6 may be disposed on a fifth insulation layer INS5. The sixth insulation layer INS6 may cover the first connection electrodes CNE1. The sixth insulation layer INS6 may overlap a light emission unit NTA. The sixth insulation layer INS6 may be extended onto the transmission unit TA, and overlap the transmission unit TA. The sixth insulation layer INS6 may be an organic layer.

A seventh insulation layer INS7 may be disposed on the sixth insulation layer INS6. The seventh insulation layer INS7 may overlap the light emission unit NTA. The seventh insulation layer INS7 may be extended onto the transmission unit TA, and overlap the transmission unit TA. The seventh insulation layer INS7 may be an organic layer.

On the seventh insulation layer INS7, a pixel definition film PDL may be disposed. The pixel definition film PDL may be disposed on the light emission unit NTA and the transmission unit TA. The pixel definition film PDL may overlap the light emission unit NTA. The pixel definition film PDL may be extended onto the transmission unit TA.

An opening PX_OP for exposing a predetermined portion of the first electrode AE to outside the pixel definition film PDL may be defined in or by portions of the pixel definition film PDL.

Although not illustrated, a sensor may be disposed below the transmission unit TA. Illustratively, the sensor may be at least one of an illuminance sensor and a proximity sensor, but may include other types of sensors without being limited thereto.

According to an embodiment of the invention, the boundary transistor BDT is disposed inclined along inclined surfaces, so that the planar area occupied by the boundary transistor BDT may be reduced compared to the planar area occupied by a transistor disposed flat. Accordingly, the planar area of the transmission unit TA may be increased, so that external light passing through the transmission unit TA may be increased. Therefore, external light input to a sensor disposed below a substrate SUB may increase.

As described above, structures of the light emission element EP and connection electrodes CNE on the seventh insulation layer INS7 are the same as the structures of the light emission element EP and the connection electrodes CNE of FIG. 7, so that descriptions thereof will be omitted.

FIG. 11 is a cross-sectional view of a pixel PX according to an embodiment of the invention.

A substrate SUB, inorganic insulation layers INS1 to INS5, a second semiconductor pattern SMP2, and a third semiconductor pattern SMP3 of FIG. 11 are the same as the substrate SUB, the inorganic insulation layers INS1 to INS5, the second semiconductor pattern SMP2, and the third semiconductor pattern SMP3 of FIG. 7, so that descriptions thereof will be brief or omitted.

Illustratively, FIG. 11 is a cross-sectional view when the display surface DS of FIG. 1 is further defined on the rear surface of the display device DD.

Illustratively, a light emission element EP disposed on a light emission unit NTA of FIG. 11 is the same as the light emission element EP of FIG. 7, so that a description thereof will be brief or omitted.

Illustratively, in FIG. 11, a third transistor T3 and a sixth transistor T6' are illustrated. In addition, the third and sixth transistors T3 and T6' may be oxide transistors.

Referring to FIG. 11, first to fifth insulation layers INS1 to INS5 may be inorganic layers. The second to fifth insulation layers may have the same refractive index as that of the substrate SUB.

On the fifth insulation layer INS5, first connection electrodes CNE1 may be disposed. Each of the first connection electrodes CNE1 may be connected to a source electrode S6' and a drain electrode D6' through corresponding contact-holes CH2 and CH3 between second and third contact-holes CH2 and CH3 defined on the third to fifth insulation layers INS3 to INS5.

A sixth insulation layer INS6 may be disposed on the fifth insulation layer INS5 and the first connection electrodes CNE1. The sixth insulation layer INS6 may overlap the light emission unit NTA and a transmission unit TA.

On the sixth insulation layer INS6, a second connection electrode CNE2 may be disposed. The second connection electrode CNE2 may be connected to the first connection electrode CNE1 through a sixth contact-hole CH6 defined on the sixth insulation layer INS6. The second connection electrode CNE2 may be connected to a first connection electrode CNE1 connected to the drain electrode D6' among the first connection electrodes CNE1.

Connection electrodes CNE may be connected to the sixth transistor T6'. Although not illustrated, on the light emission unit NTA, first to fifth, and seventh transistors T1 to T5, and T7 may be disposed. The first to seventh transistors T1 to T7 may be connected to each other. Therefore, the connection electrodes CNE may be connected to the first to fifth, and seventh transistors T1 to T5, and T7 through the sixth transistor T6'. Hereinafter, the sixth transistor T6' may be defined as a dummy transistor T6'.

A seventh insulation layer INS7 may be disposed on the sixth insulation layer INS6. The seventh insulation layer INS7 may cover the second connection electrode CNE2. The seventh insulation layer INS7 may overlap the light emission unit NTA and the transmission unit TA.

Light emission elements EP and EP' may be disposed on the light emission unit NTA and the transmission unit TA of the substrate SUB. On the transmission unit TA, a dummy light emission element EP' may be disposed. Since the light emission element EP disposed on the light emission unit NTA has been described with reference to FIG. 7, the dummy light emission element EP' disposed on the transmission unit TA will be described hereinafter.

The dummy light emission element EP' may include a first electrode AE', a second electrode CE', a hole control layer HCL', an electron control layer ECL', and a light emission layer EML'. The first electrode AE' may be the anode AE illustrated in FIG. 6, and the second electrode CE' may be the cathode CE illustrated in FIG. 6.

The first electrode AE' may be disposed on the seventh insulation layer INS7. The first electrode AE' may be electrically connected to the second connection electrode CNE2 through a seventh contact-hole CH7 defined on the seventh insulation layer INS7. Accordingly, the dummy light emission element EP' may be connected to the dummy transistor T6' disposed on the transmission unit TA. The dummy light emission element EP' may be connected to the first to fifth, and seventh transistors T1 to T5, and T7 through the dummy transistors T6'. The first electrode AE' may have a structure formed of a transparent conductive layer. For example, the first electrode AE' may include a transparent conductive material such as indium-tin oxide or indium-zinc oxide.

A pixel definition film PDL may be disposed on the light emission unit NTA and the transmission unit TA. The pixel definition film PDL may have or define an opening PX_OP' as a second opening for exposing a predetermined portion of the first electrode AE' to outside the pixel definition film PDL defined on the first electrode AE' and the seventh insulation layer INS7.

The hole control layer HCL' may be disposed on the first electrode AE'. The hole control layer HCL' may be commonly disposed in a light emission portion LRE and a non-light emission portion NLRE. The hole control layer HCL may include a hole transport layer and a hole injection layer.

The light emission layer EML' may be disposed on the hole control layer HCL' and the first electrode AE'. The light emission layer EML' may be disposed in a region corresponding to the opening PX_OP'. The light emission layer EML' may include an organic material and/or an inorganic material. The light emission layer EML' may generate light of any one of red, green, and blue colors.

The electron control layer ECL' may be disposed on the light emission layer EML' and the hole control layer HCL'. The electron control layer ECL' may be commonly disposed in the light emission portion LRE and the non-light emission portion NLRE. The electron control layer ECL' may include an electron transport layer and an electron injection layer.

The second electrode CE' may be disposed on the electron control layer ECL'. The second electrode CE' may be commonly disposed in pixels PX. The second electrode CE' may include a light reflecting material such as aluminum (Al), silver (Ag), molybdenum (‘Mo), or titanium (Ti).

The dummy light emission element EP' disposed on the transmission unit TA of the substrate SUB and the light emission element EP disposed on the light emission unit NTA of the substrate SUB may each emit light, but in directions opposite to each other along the third direction DR3 as a light emission direction. On the substrate SUB adjacent to the boundary between the light emission unit NTA and the transmission unit TA, layers or patterns of the dummy transistor T6' are disposed inclined along inclined surfaces of insulating layers, so that a light emission portion LRE' of the dummy light emission element EP' disposed on the transmission unit TA may increase. Accordingly, light transmittance may be increased and light emission or image display may be achieved at the rear surface of the display device DD.

A thin film encapsulation layer TFE may be disposed on the light emission elements EP and EP'. The thin film encapsulation layer TFE may include an inorganic layer, an organic layer, and an inorganic layer sequentially laminated. The inorganic layers include an inorganic material, and may protect the pixels PX from moisture/oxygen. The organic layer includes an organic material, and may protect the pixels PX from foreign materials such as dust particles.

According to one or more embodiment of the invention, a boundary transistor BDT adjacent to a boundary of a light emission region EAP and a transmission region TAP may be disposed inclined along inclined surfaces. A planar area occupied by patterns or layers of the boundary transistors BDT may be smaller than a planar area of horizontally disposed transistors including patterns or layers thereof coplanar or flat. Accordingly, the planar area occupied by the transistors TR decreases, so that the planar area of the transmission region TAP may increase. Therefore, the light transmittance of the transmission region TAP may be improved.

In an embodiment, a substrate SUB includes a light emission area (EAP or NTA, for example), a light transmission area (TAP or TA, for example) adjacent to the light emission area, and a boundary between the light emission area and the light transmission area. In the light emission area are each of a circuit layer (DP-CL) including a plurality of transistors TR each including a semiconductor pattern and a gate, a plurality of inorganic insulation layers on the semiconductor pattern and on the gate, a light emission element EP which is on the plurality of inorganic insulation layers and connected to the circuit layer, the plurality of inorganic insulation layers respectively defining inclined side surfaces corresponding to the boundary between the light emission area and the light transmission area, among the plurality of transistors, a boundary transistor BDT which is closest to the boundary between the light emission area and the light transmission area. The semiconductor pattern and the gate of the boundary transistor BDT are each inclined along the inclined side surfaces of the plurality of inorganic insulation layers.

In an embodiment, the plurality of transistors may be excluded from the light transmission area, such as shown in FIGS. 7, 8 and 9.

In an embodiment, in the light emission area, a buffer layer BFL may be below the plurality of inorganic insulation layers. The buffer layer BFL may be excluded from the light transmission area and define a buffer layer inclined side surface corresponding to the inclined side surfaces of the plurality of inorganic insulation layers.

In an embodiment, in the light emission area, a barrier layer BRL may be between the buffer layer BFL and the substrate SUB. The barrier layer BRL may be excluded from the light transmission area and define a barrier layer inclined side surface corresponding to the inclined side surfaces of the plurality of inorganic insulation layers.

In an embodiment, the plurality of transistors may further include the gate on the semiconductor pattern, and a silicon transistor. Among the plurality of inorganic insulation layers a first insulation layer may be on the semiconductor pattern of the silicon transistor, define a first inclined side surface among the inclined side surfaces of the plurality of inorganic insulation layers, and be excluded from the light transmission area, a second insulation layer may be on the gate of the silicon transistor and on the first insulation layer, define a second inclined side surface among the inclined side surfaces of the plurality of inorganic insulation layers, and be in both the light emission area and the light transmission area, and a third insulation layer may be on the second insulation layer, define a third inclined side surface among the inclined side surfaces of the plurality of inorganic insulation layers, and be in both the light emission area and the light transmission area.

In an embodiment, the plurality of transistors may further include an oxide transistor. Among the plurality of inorganic insulation layers a fourth insulation layer may be on the semiconductor pattern of the oxide transistor and the third insulation layer, define a fourth inclined side surface among the inclined side surfaces of the plurality of inorganic insulation layers, and be in both the light emission area and the light transmission area, and a fifth insulation layer may be on the gate of the oxide transistor and the fourth insulation layer, define a fifth inclined side surface among the inclined side surfaces of the plurality of inorganic insulation layers, and be in both the light emission area and the light transmission area.

In an embodiment, the boundary transistor may include the oxide transistor.

In an embodiment, the light emission area may further include an organic insulation layer further from the substrate than the plurality of inorganic insulation layers, and the light emission element on the organic insulation layer.

In embodiments, the organic insulation layer may variously cover the boundary transistor (e.g., FIGS. 7, 8 and 9), be excluded from the light transmission area (e.g., FIGS. 7, 8 and 9), and be included in the light transmission area (e.g., FIGS. 10 and 11).

In an embodiment, a sensor may be below the substrate, and in the light transmission area, the sensor overlaps the organic insulation layer.

In an embodiment, the organic insulation layer defines an organic layer inclined side surface corresponding to the inclined side surfaces of the plurality of inorganic insulation layers, and the pixel definition layer is excluded from the light transmission area and covers the organic layer inclined side surface.

In an embodiment, the boundary transistor BDT includes a dummy transistor which is connected to the dummy light emission element, and the light emission element EP and the dummy light emission element EP' emit light in directions opposite to each other.

Although the invention has been described with reference embodiments of the invention, it will be understood by those skilled in the art that various modifications and changes in form and details may be made therein without departing from the spirit and scope of the invention as set forth in the following claims. In addition, the embodiments disclosed in the invention are not intended to limit the technical spirit of the invention, and all technical concepts falling within the scope of the following claims and equivalents thereof are to be construed as being included in the scope of the invention.

What is claimed is:

1. A display device comprising:

a substrate including a display region and a non-display region which is adjacent to the display region;

the display region including a light emission area and a light transmission area which is adjacent to the light emission area; and in the light emission area of the display region:

a plurality of transistors disposed on the substrate, and each including a semiconductor pattern and a gate;

a plurality of inorganic insulation layers covering the semiconductor pattern and the gate;

a light emission element which is on the plurality of inorganic insulation layers and connected to the transistors;

a boundary between the light emission area and the light transmission area;

the inorganic insulation layers having inclined surfaces adjacent to the boundary; and among the plurality of transistors:

a boundary transistor is closest to the boundary, another transistor is further from the boundary than the boundary transistor is from the boundary, and a portion of the gate of the boundary transistor and a portion of the semiconductor pattern of the boundary transistor are disposed to be inclined along the inclined surfaces.

2. The display device of claim 1, wherein each of the substrate and the plurality of inorganic insulation layers has a refractive index, and the refractive index of the substrate is the same as the refractive index of at least one layer among the plurality of inorganic insulation layers.

3. The display device of claim 1, wherein the plurality of transistors are excluded from the light transmission area.

4. The display device of claim 1, further comprising in the light emission area, a buffer layer below the plurality of inorganic insulation layers, wherein the buffer layer is excluded from the light transmission area and defines a buffer layer inclined side surface corresponding to the inclined side surfaces of the plurality of inorganic insulation layers.

5. The display device of claim 4, further comprising in the light emission area, a barrier layer between the buffer layer and the substrate, wherein the barrier layer is excluded from the light transmission area and defines a barrier layer inclined side surface corresponding to the inclined side surfaces of the plurality of inorganic insulation layers.

6. The display device of claim 5, wherein the buffer layer and the barrier layer each comprise an inorganic layer.

7. The display device of claim 1, wherein the plurality of transistors further comprises:

a silicon transistor; and among the plurality of inorganic insulation layers:

a first insulation layer which is on the semiconductor pattern of the silicon transistor, defines a first inclined side surface among the inclined side surfaces of the plurality of inorganic insulation layers, and is excluded from the light transmission area;

a second insulation layer which is on the gate of the silicon transistor and on the first insulation layer, defines a second inclined side surface among the inclined side surfaces of the plurality of inorganic insulation layers, and is in both the light emission area and the light transmission area; and a third insulation layer which is on the second insulation layer, defines a third inclined side surface among the inclined side surfaces of the plurality of inorganic insulation layers, and is in both the light emission area and the light transmission area.

8. The display device of claim 7, wherein in the light transmission area:

each of the substrate, the second insulation layer and the third insulation layer has a refractive index, and the refractive index of the substrate, the second insulation layer and the third insulation layer are the same as each other.

9. The display device of claim 8, wherein the plurality of transistors further comprises an oxide transistor;

the boundary transistor comprises the oxide transistor; and among the plurality of inorganic insulation layers:

a fourth insulation layer is on the semiconductor pattern of the oxide transistor and the third insulation layer, defines a fourth inclined side surface among the inclined side surfaces of the plurality of inorganic insulation layers, and is in both the light emission area and the light transmission area; and a fifth insulation layer is on the gate of the oxide transistor and the fourth insulation layer, defines a fifth inclined side surface among the inclined side surfaces of the plurality of inorganic insulation layers, and is in both the light emission area and the light transmission area.

10. The display device of claim 1, wherein among the plurality of transistors, the gate and the semiconductor pattern of the another transistor are disposed flat along the inorganic insulation layers.

11. The display device of claim 9, wherein in the light transmission area:

each of the substrate, the fourth insulation layer and the fifth insulation layer has a refractive index, and the refractive index of the substrate, the fourth insulation layer and the fifth insulation layer are the same as each other.

12. The display device of claim 1, further comprising an organic insulation layer overlapping the light emission area, and disposed between the light emission element and the inorganic insulation layers, wherein the light emission element is on the organic insulation layer.

13. The display device of claim 12, wherein in the light emission area, the organic insulation layer covers the boundary transistor.

14. The display device of claim 12, wherein the organic insulation layer is excluded from the light transmission area.

15. The display device of claim 12, wherein the organic insulation layer is in the light transmission area.

16. The display device of claim 15, further comprising a sensor below the substrate, wherein in the light transmission area, the sensor overlaps the organic insulation layer.

17. The display device of claim 12, further comprising a pixel definition layer on the organic insulation layer and in which an opening of the pixel definition layer is defined, wherein the light emission element includes:

an anode which is on the organic insulation layer, exposed to outside the pixel definition layer by the opening, and at which the light emission element is connected to the transistors;

a light emission layer which is on the anode and in the opening; and a cathode on the light emission layer.

18. The display device of claim 17, wherein the pixel definition layer is excluded from the light transmission area and covers a side surface of the organic insulation layer adjacent to the boundary.

19. The display device of claim 17, wherein both of the organic insulation layer and the pixel definition layer are in the light transmission area.

20. The display device of claim 1, further comprising in the light emission area:

a dummy light emission element; and the boundary transistor comprising a dummy transistor which is connected to the dummy light emission element, wherein the light emission element and the dummy light emission element emit light in directions opposite to each other.

* * * * *